United States Patent [19]
Mizuno et al.

[11] Patent Number: 5,822,133
[45] Date of Patent: Oct. 13, 1998

[54] OPTICAL STRUCTURE AND DEVICE MANUFACTURING METHOD USING THE SAME

[75] Inventors: Makoto Mizuno; Ryuichi Ebinuma; Toshinori Minowa, all of Utsunomiya, Japan

[73] Assignee: Canon Kabushiki Kaisha, Tokyo, Japan

[21] Appl. No.: 695,203

[22] Filed: Aug. 1, 1996

[30] Foreign Application Priority Data

Aug. 7, 1995 [JP] Japan ................... 7-219461
Jul. 16, 1996 [JP] Japan ................... 8-204168

[51] Int. Cl.⁶ ................................. G02B 15/14
[52] U.S. Cl. .................. 359/696; 359/823; 378/34; 250/491.1
[58] Field of Search ................... 359/696, 823, 359/824, 814, 811; 378/34, 35; 250/491.1, 491.2

[56] References Cited

U.S. PATENT DOCUMENTS

| | | | |
|---|---|---|---|
| 4,840,457 | 6/1989 | Remer | 359/824 |
| 4,882,723 | 11/1989 | Van Rosmalen | 359/824 |
| 4,927,235 | 5/1990 | Narumi | 359/824 |
| 4,999,506 | 3/1991 | Mizusawa et al. | 250/491.1 |
| 5,112,133 | 5/1992 | Kurosawa et al. | 356/401 |
| 5,125,014 | 6/1992 | Watanabe et al. | 378/34 |
| 5,128,975 | 7/1992 | Iwamoto et al. | 378/34 |
| 5,130,854 | 7/1992 | Suzuki | 359/823 |
| 5,138,643 | 8/1992 | Sakamoto et al. | 378/34 |
| 5,150,391 | 9/1992 | Ebinuma et al. | 378/34 |
| 5,168,512 | 12/1992 | Iwamoto et al. | 378/34 |
| 5,172,402 | 12/1992 | Mizusawa et al. | 378/34 |
| 5,220,171 | 6/1993 | Hara et al. | 250/443.1 |
| 5,285,488 | 2/1994 | Watanabe et al. | 378/34 |
| 5,303,080 | 4/1994 | O'Brien et al. | 359/824 |
| 5,313,333 | 5/1994 | O'Brien et al. | 359/811 |
| 5,317,615 | 5/1994 | Ebinuma et al. | 378/34 |
| 5,347,561 | 9/1994 | Ebinuma | 378/34 |
| 5,377,251 | 12/1994 | Mizusawa et al. | 378/34 |
| 5,413,167 | 5/1995 | Hara et al. | 165/86 |
| 5,593,800 | 1/1997 | Fujioka et al. | 430/5 |

FOREIGN PATENT DOCUMENTS 6-226570  8/1994  Japan .

*Primary Examiner*—Loha Ben
*Attorney, Agent, or Firm*—Fitzpatrick, Cella, Harper & Scinto

[57] ABSTRACT

An optical component moving device having a driving portion and guiding portion, for moving an optical component, wherein the driving portion includes fluid enclosure system being expandable and contractible and the guiding portion includes a leaf spring.

21 Claims, 24 Drawing Sheets

TILT CORRECTING MECHANISM

PARALLEL SPRING MECHANISM

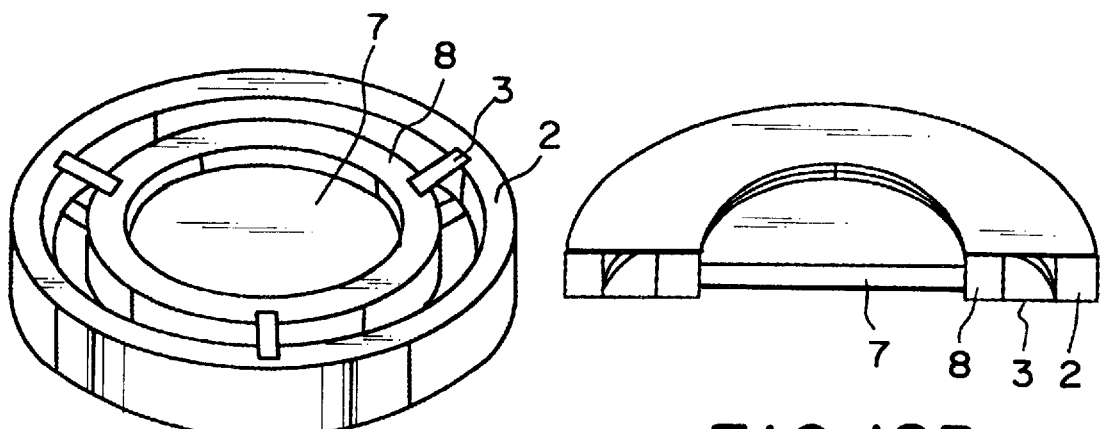
FIG. 18A
FIG. 18B
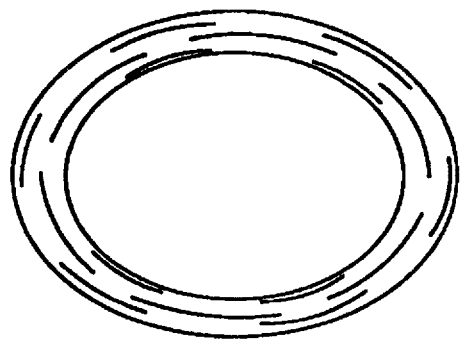
FIG. 18C
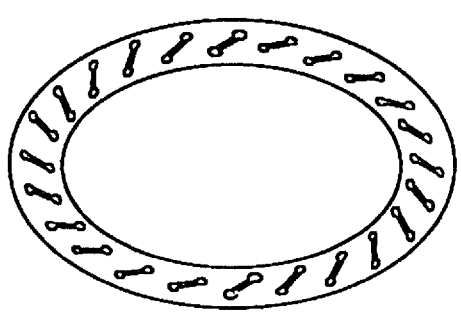
FIG. 18D
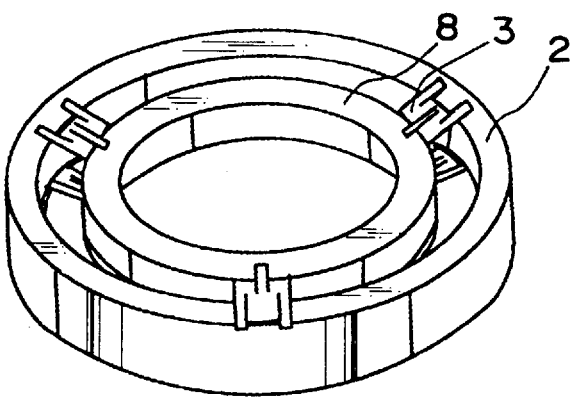
FIG. 18E
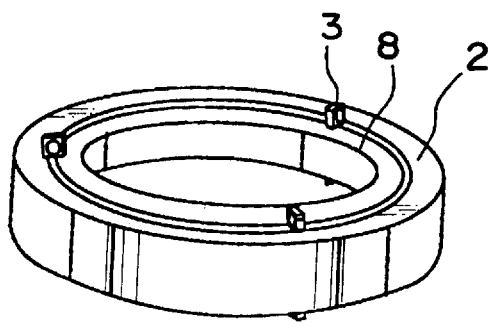
FIG. 18F

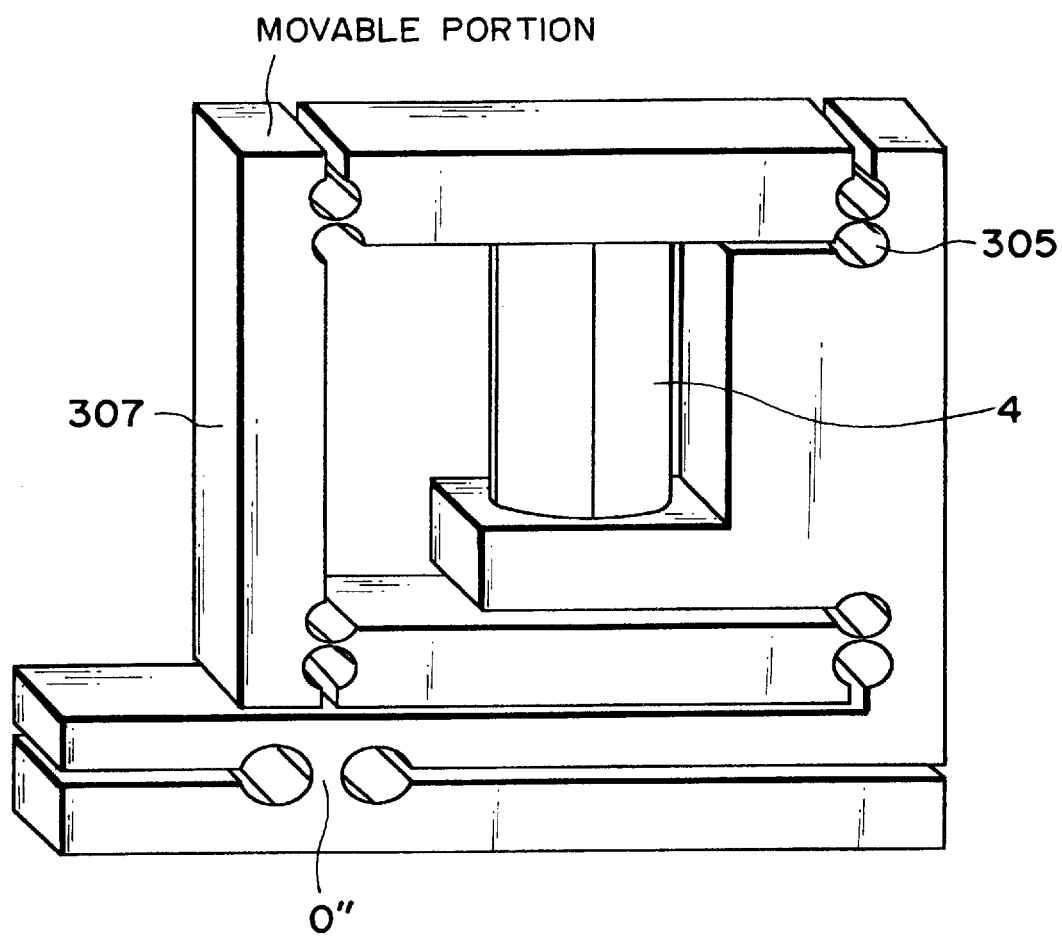
F I G. 27

OPTICAL STRUCTURE AND DEVICE MANUFACTURING METHOD USING THE SAME

FIELD OF THE INVENTION AND RELATED ART

This invention relates to an optical structure for adjusting an optical characteristic, such as magnification, aberration or distortion, for example, of a projection optical system of an exposure apparatus, for example. More particularly, the invention is concerned with an optical structure usable, as an additional optical system, with a projection optical system of a semiconductor exposure apparatus (mask aligner), for example, for assuring exact imaging relationship when an image of an original such as a mask or reticle is going to be projected on an object such as a wafer, for example.

A semiconductor exposure apparatus is an apparatus for transferring an original (reticle) having different types of patterns onto a silicon wafer (substrate). For manufacture of a circuit of high density, not only resolution but also registration precision should be improved.

Registration error in a semiconductor exposure apparatus may be an alignment error, image distortion or magnification error. The alignment error can be reduced by relative position adjustment to an original (reticle) and a substrate (wafer). On the other hand, magnification error can be adjusted by moving a portion of a projection optical system along an optical axis direction. In the motion along the optical axis direction, other components out of the movement direction, particularly, parallel shift and tilt error, have to be suppressed.

Japanese Laid-Open Patent Application, Laid-Open No. 226570/1994 shows a projection magnification adjusting system for a semiconductor exposure apparatus, which comprises a lens moving device having a mechanism with a wedge. FIG. 30 is a partially cutaway plan view showing such mechanism. FIG. 31 is a sectional view taken along a line C—C. As illustrated in these drawings, the lens moving device comprises a ring-like cell 8 for holding a lens 7, and an annular lens fixing member 22 for supporting the cell. The lens fixing member 22 includes a cylindrical fixed guide 22a mounted on an outer peripheral portion of the fixing member 22, and an actuator supporting plate 22j provided integrally on the outer peripheral edge of the lens fixing member 22.

As shown in FIG. 31, disposed between the cell 8 and the lens fixing member 22 is a ring-like lens driving member 24 which has wedge-like sectional shape in a direction (X direction) depicted by line C—C in FIG. 30 and whose thickness in a direction (Y direction) perpendicular to that direction is unchanged. Radially outwardly protruding connecting member 24a is provided integrally at an end of the lens driving member 24 in the X direction. The connecting member 24a is integrally and fixedly connected to a connecting rod 25a of an actuator (driving means) 25 which comprises a linear motor, for example, and which is supported by an actuator supporting plate 25j. Also, radially outwardly protruding guide member 24b is integrally provided at the other end of the lens driving member 24 in the X direction. Similarly, the cell 8 has a rotation lock guide 21a provided at the position as overlapped by the guide member 24b of the lens driving member 24.

The cylindrical fixed guide 22a has radially extending bores 22i and 22k at opposite ends thereof in the X direction. Paired guide blocks 22b and 22c, and 22d and 22e fixed to the bottom lens fixing member 22 are disposed in these bores 22i and 22k. The guide blocks 22b and 22c provided in one bore 22i are disposed opposed to the opposite ends of the connecting member 24a of the lens driving member 24, respectively. The guide blocks 22d and 22e provided in the other bore 22k are disposed opposed to the opposite side faces of the guide member 24b of the lens driving member 24 and the rotation lock guide 21a of the cell 8, respectively.

Annular tab 22f is provided integrally on the upper end portion of the cylindrical fixed guide 22a, and it protrudes radially inwardly from the inner circumferential edge of the fixed guide. The tap 22f serves to define an annular pressurizing chamber 27 of substantially closed space, between it and a stepped portion 21b formed at the upper end of the cell 8. A restriction 27a is formed between the outer circumferential surface of the cell 8 and the inner circumferential surface of the tab 22f. Pressurized air is supplied from an inside piping 27b which is pressurized air supplying means for the cylindrical fixed guide 22a, to the pressurizing chamber 27, and the stepped portion 21b of the cell 8 is pressed downwardly by the increasing air pressure. As a result, the cell is biased toward the lens fixing member 22 together with the lens driving member 24.

Provided on the top surface of the lens fixing member 22 and on the bottom surface of the cell 8 are annular static pressure bearing pads (first and second static pressure bearing means) 26a and 26b. Between these static pressure bearing pads 26a and 26b, the lens driving member 24 is supported without contact and reciprocally movably. The top surface of the lens driving member 24 is inclined toward the X direction, and also the bottom surface of the cell 8 is inclined similarly with the same tilt angle. Thus, as the lens driving member 24 is moved in the X direction by the actuator 25, the cell moves in a direction (Z direction) normal to the X and Y directions, while keeping the parallelism with the lens fixing member 22. Here, among the movement amount δX of the lens driving member 24 in the X direction, the tilt angle θ with the slant surfaces of the lens driving member 24 and the cell 8, and the movement amount δZ of the cell in the Z direction, there is a relation δZ=δX·tan(θ).

The cylindrical fixed guide 22a has an annular static pressure bearing pad (third static pressure bearing surface) 26c provided on the inner circumferential surface thereof opposed to the outer circumferential surface of the cell 8. This bearing pad serves to support the cell 8 without contact thereto and reciprocally movably. The guide blocks 22b–22e are provided with static pressure bearing pads 26d–26g which are disposed on the surface opposed to the connecting member 24a of the lens driving member 24 of the cell 8 and on the surface opposed to the rotation lock guide 21a of the cell and the guide member 24b of the lens driving member 24. By means of these bearing pads, the connecting member 24a, the guide member 24b and the rotation lock guide 21a are supported without contact.

The mechanism described above is effective to control the lens position in the optical axis direction very precisely. Additionally, it supports the lens stably. During motion of the lens, there does not occur rolling or pitching. Also, there is no necessity of lubricant oil. Thus, high cleanness is assured.

SUMMARY OF THE INVENTION

However, the lens diameter of a projection optical system for an exposure apparatus is being increased to meet further miniaturization of a semiconductor circuit and further enlargement of exposure region. This makes the exposure apparatus itself larger and, as a result, the rigidity smaller. It is therefore desirable that the components of the projection optical system a re small and light in weight.

It is accordingly an object of the present invention to provide a compact and light weight arrangement for moving optical components, for adjusting magnification, aberration or distortion of a projection optical system, at high precision and along an optical axis.

In accordance with an aspect of the present invention, there is provided an optical structure, comprising driving means for moving an optical element along a direction of optical axis, and having fluid enclosure means being expandable and contractible; guiding means for guiding motion of the optical element; and control means for controlling one of volume and pressure of a fluid within said fluid enclosure means.

With the above arrangement, the control means for controlling the volume or pressure inside the driving means can be disposed separate from the driving means or the optical element to be moved. Therefore, substantially no element protrudes outwardly from a circular outside periphery of a moving mechanism, having the driving means or guiding means. Thus, the moving mechanism can be compact, occupying a small space.

Further, since the moving mechanism can be made light in weight and there is no sliding portion in the moving mechanism, production of dust or foreign particle is suppressed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 18A–18F are schematic views of a resilient element, used or to be used in the mechanism shown in FIG. 14, 19, 20 or 21.

FIG. 27 is a perspective view of an integral-type parallel spring mechanism, according to a tenth embodiment of the present invention.

DESCRIPTION OF THE PREFERRED EMBODIMENTS

Preferred embodiments of the present invention will be described with reference to the drawings.

[Embodiment 1]

Figure 1:
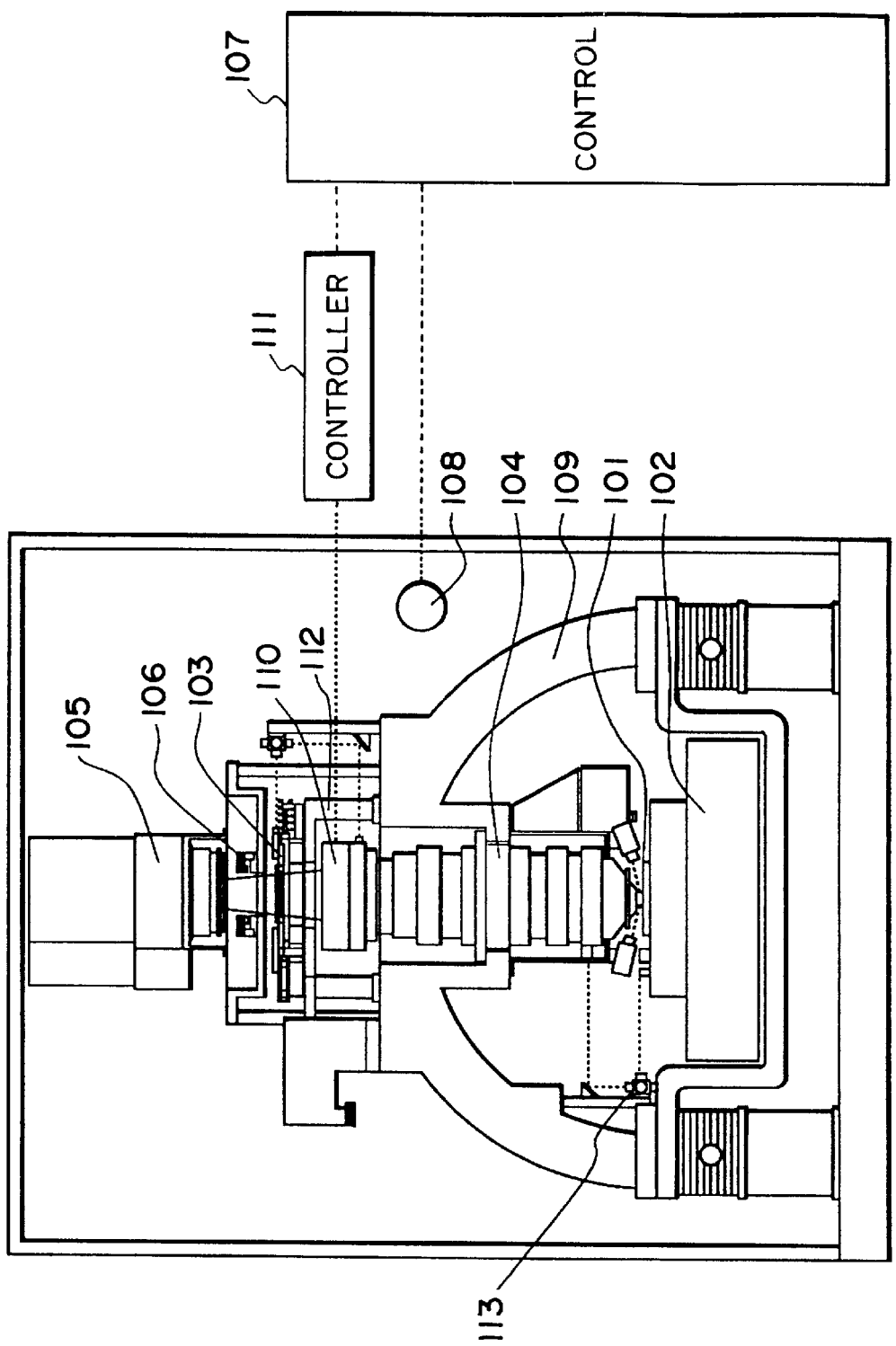
FIG. 1 is a schematic view of an exposure apparatus to which the present invention is applicable.

FIG. 1 shows a general structure of an exposure apparatus to which the present invention is applicable. Denoted in FIG.

1 at 101 is a semiconductor wafer to which a photosensitive material is applied. It is placed on a wafer stage 102 having high precision positioning performance. The position of the wafer stage with respect to a reference of the exposure apparatus is measured by means of a laser interferometer 113. Denoted at 103 is a reticle on which a pattern (original) is formed. Projection optical system 104 is provided with an optical component moving means 110 according to the present invention, and it serves to image the pattern of the reticle upon the wafer. Denoted at 105 is an illumination optical system for illuminating the reticle. Denoted at 106 is an alignment optical system for detecting a positional deviation between the reticle and a pattern formed on the wafer through a preceding process or processes. By means of the alignment optical system 106 and the wafer stage 102, the pattern of the reticle and the pattern of the wafer are brought into registration, and superposed printing is performed.

Denoted at 107 is a control system for controlling the operation of the exposure apparatus such as described above. Through cooperation of the alignment optical system and the laser interferometer which measures the position of the wafer stage, the size of the pattern of the wafer can be measured. From this size, the control system sets the position of the optical component of components by which optimum optical performance is provided.

On the other hand, as a variation factor of projection magnification which is one of optical characteristics of the projection optical system, there is a change in ambience such as pressure. Denoted at 108 is a pressure sensor. On the basis of pressure information produced by the pressure sensor or of a value of optimum exposure magnification, the control system determines the optimum position of a lens or lenses for projection magnification adjustment, and it applies a corresponding position signal to a controller 111 of the optical component moving means. Denoted in FIG. 1 at 109 is a base (lower) for supporting the projection optical system 104, and at 112 is a base (upper) supported by the base (lower) 111 and for supporting the illumination optical system 105 and the alignment optical system 106.

Figure 2A:
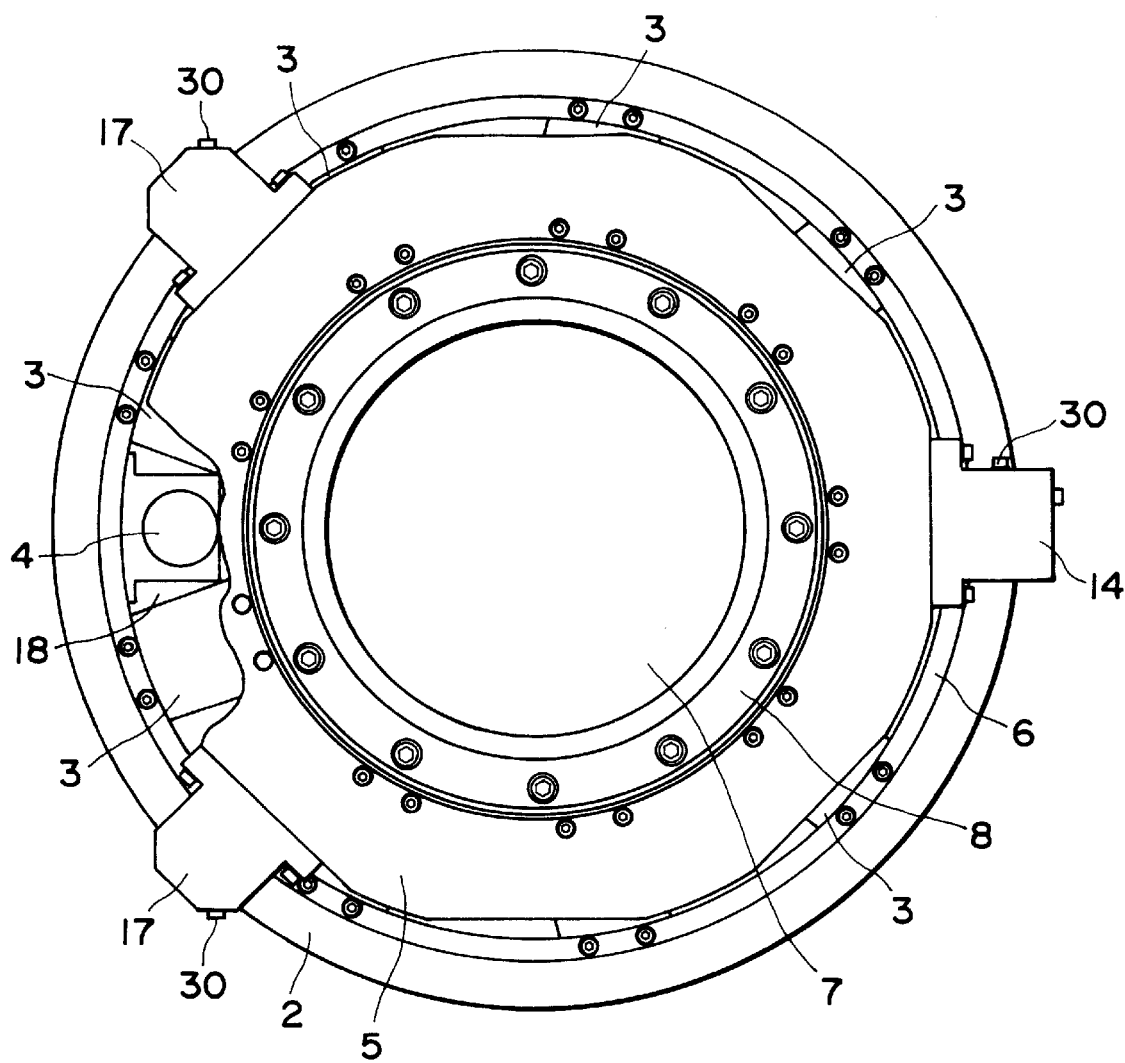
FIGS. 2A and 2B are a plan view and a sectional view of an optical component moving mechanism with a tilt correction function, according to a first embodiment of the present invention.
Figure 2B:
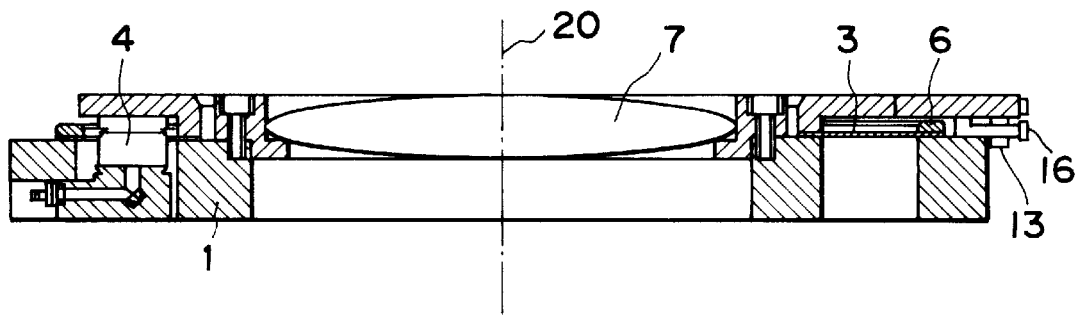

FIGS. 2A and 2B are a plan view and a sectional view of an optical component moving mechanism with tilt correction function, according to an embodiment of the present invention. The mechanism includes a movable table 1 on which an adjusting lens 7 for adjustment of magnification or aberration, for example, and a cell 8 for supporting the lens 7, are mounted. The mechanism further includes a fixed table 2 which forms a part of a fixed portion of the projection optical system 104 of FIG. 1. Driving element 4 comprises a bellows, for example, and an end thereof is fixed to the fixed table 2. The other end thereof is fixed to a clamping top plate 5 which is coupled to the movable table 1. The movable table 1 and the fixed table 2 cooperate to provide a spring mechanism having a set of two or more leaf springs 3 and a leaf spring keeper 6 for supporting the leaf springs.

The driving element 4 used in the leaf spring mechanism in the form as of this embodiment wherein leaf springs 3 are disposed at the outer circumference of the movable table 1 of cylindrical shape, should desirably satisfy the condition that drive is performed at a single central point of the movable table 1 or at those points which are symmetrical with respect to the optical axis 20, in the point of motion precision of the movable table 1. If the present invention is applied, however, in the former disposition the point corresponds to the optical axis 20. It is therefore difficult to set the driving point at that point. The former disposition should be preferably be selected.

Figure 3A:
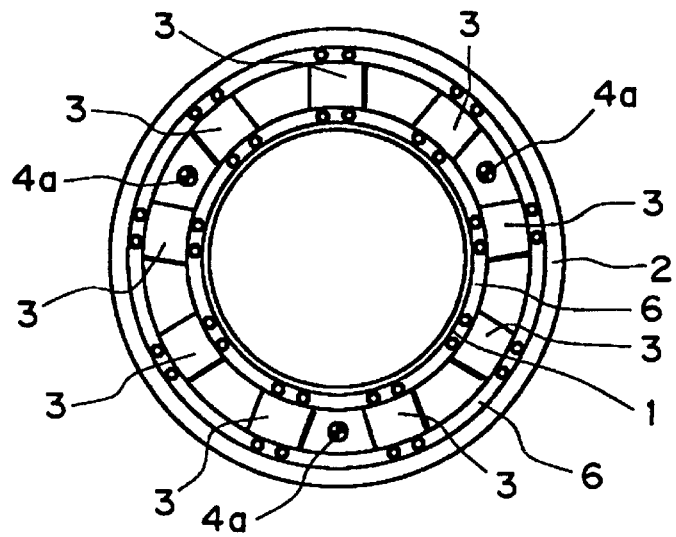
FIGS. 3A–3C are schematic views for explaining disposition of leaf springs and driving elements, in the mechanism of FIGS. 2A and 2B.
Figure 3B:
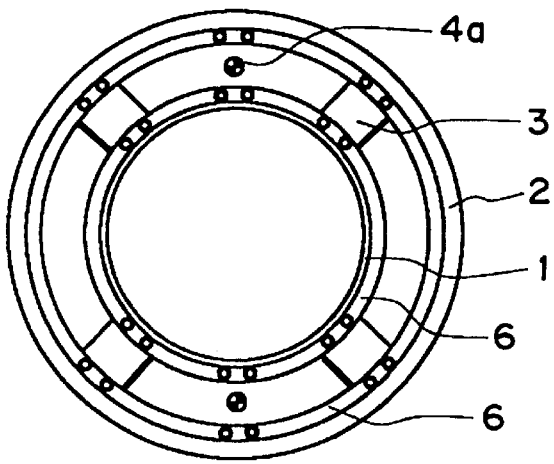
Figure 3C:
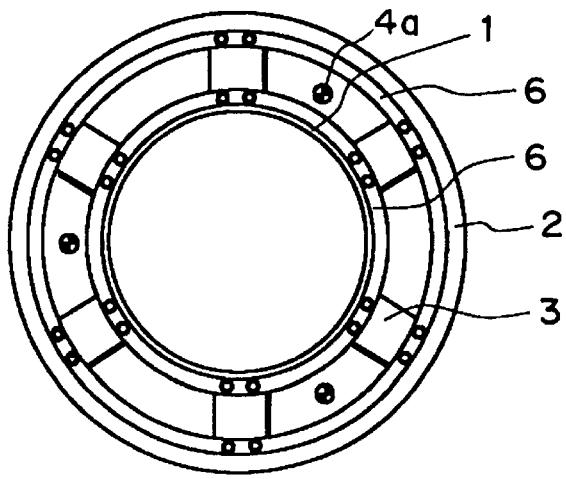

On the other hand, a driving point closer to the optical axis 20 can reduce unwanted deformation of the clamping top plate 5 which connects the driving element 4 and the movable table 1. Also, in a case where the leaf spring means with tilt correction function comprises plural leaf spring elements as in this embodiment, the driving element 4 can be placed in the space between adjacent leaf spring elements 3. This effectively saves the space. In this embodiment, as shown in FIG. 3A, the leaf spring means comprises nine leaf spring elements 3, and the driving point 4a is placed in the space between the leaf spring elements 3, being defined by trisection around the optical axis. In this example, the number of leaf spring elements 3 (i.e., nine) and the number of driving elements 4 (i.e., three) are not mutually prime, that is, they have a common factor (a common divisor other than 1). As shown in FIGS. 3A–3C, if the number of the leaf spring elements (i.e., four in FIG. 3B and six in FIG. 3C) and the number of the driving elements 4 are not mutually prime, the driving elements 4 can be placed in the spaces among the leaf spring elements 3, symmetrically with respect to the optical axis. The leaf spring elements 3 may desirably be connected into an integral structure, so that the problem of assembling positional precision is converted into the problem of machining precision.

Figure 4:
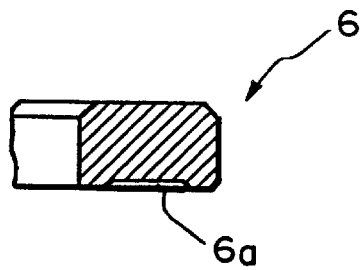
FIG. 4 is a fragmentary and sectional view of a leaf spring keeper of the mechanism of FIGS. 2A and 2B.
Figure 5A:
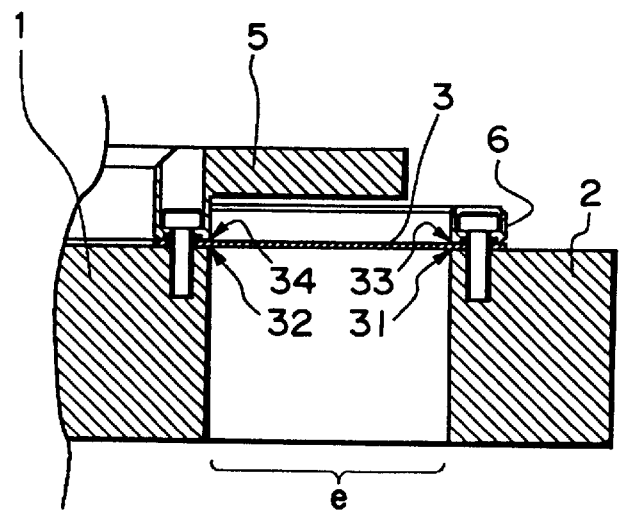
FIGS. 5A and 5B are sectional views for explaining engagement of a leaf spring keeper in the mechanism of FIGS. 2A and 2B.

FIG. 4 is a sectional view showing details of the leaf spring keeper 6, and FIG. 5A is a sectional view showing details of the leaf springs 3 and leaf spring keeper 6. As shown in FIG. 5A, the leaf spring keeper 6 is connected to the fixed table 2 and to the movable table 1 by screws extending through bores formed in the leaf springs 3. Each leaf spring keeper 6 does not serve to mount a single leaf spring. Rather, each leaf spring keeper 6 is formed into an annular shape in order that the leaf springs (elements) 3 have the same effective length e or that all the leaf springs (elements) 3 are fixed at once. Also, the leaf spring keepers 6 have grooves formed in their surface contacting to the leaf springs 3 in order that the leaf springs are fixed uniformly as much as possible.

In the leaf spring mechanism of this embodiment, a difference in effective length e among the leaf spring elements affects the motion precision and assembling precision of the movable table 1. Therefore, high machining precision is required to an inside wall corner 31 of the fixed table 2, an outside wall corner 32 of the movable table 1, an inside wall corner 33 of the leaf spring keeper 6 at the fixed table 2 side and an outside corner 34 of the clamping top plate 5 for holding leaf springs at the movable table 1 side, which determine the effective length e of the leaf spring. In the example of FIG. 5A, these corners 31–34 are normal. However, they may be formed into a uniform arcuate shape, so that concentration of stresses applied to the leaf spring 3 is reduced.

Figure 6:
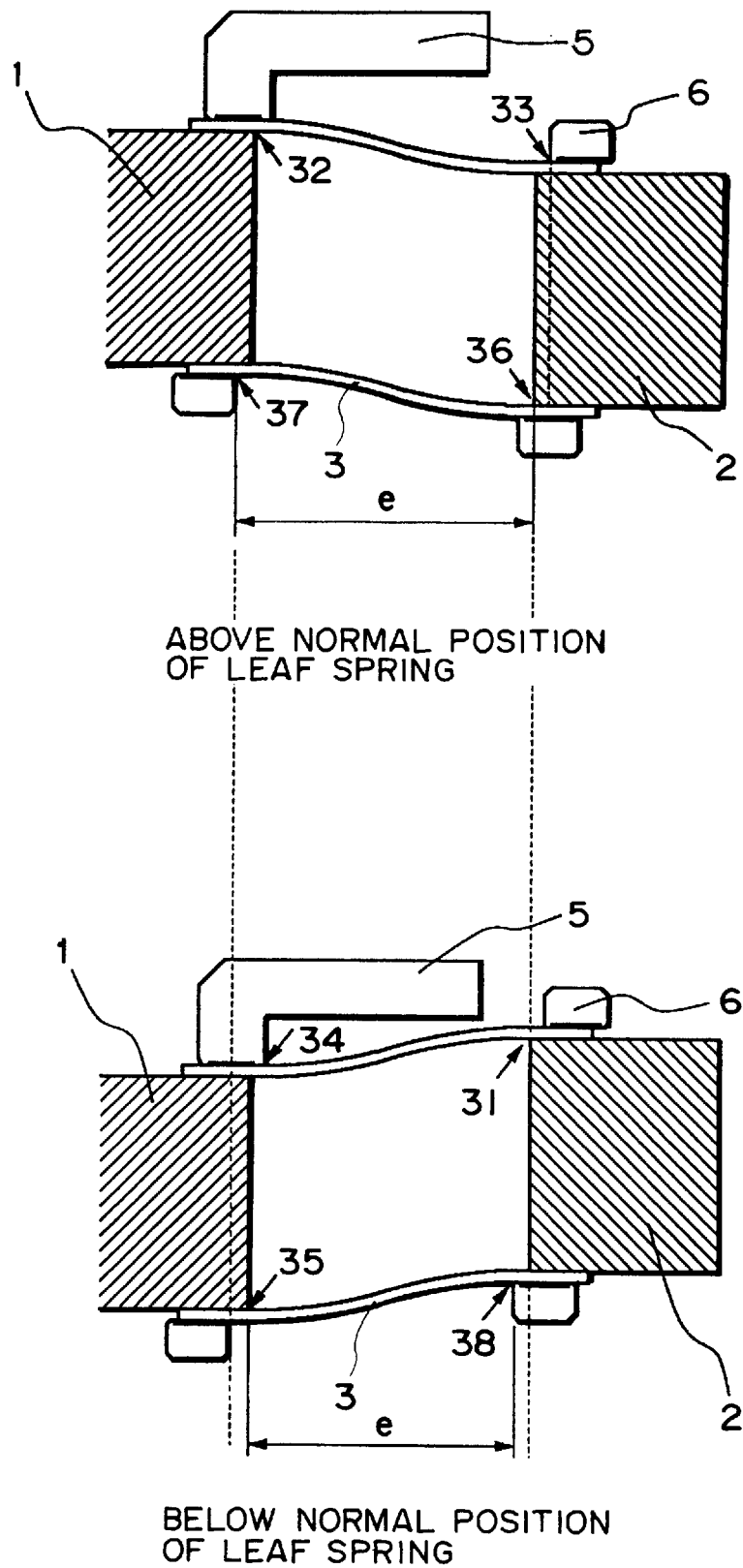
FIG. 6 is a schematic and sectional view for explaining details of a leaf spring fixing portion of the mechanism of FIGS. 2A and 2B.

Exactly, however, there is a size error in portions of the leaf spring keeper 6, clamping top plate 5, movable table 1 and fixed table 6 which determine the effective length e of the leaf spring, that is, in the size of corners 31–34 described above. As a result, the effective member e changes if a member that defines the effective length e at above or below of the neutral position of the leaf spring 3 (i.e., the position where no deformation is produced in the leaf spring 3), changes. FIGS. 6A and 6B show details of leaf spring fixation in a parallel spring mechanism wherein opposite side surfaces of the movable table 1 and the fixed table 2 are connected by means of leaf springs. FIG. 6A corresponds to a state wherein the movable portion is raised above the neutral position of the leaf spring 3. The effective length e of the leaf spring is determined by portions 32, 33 and so on depicted by arrows. On the other hand, FIG. 6B corresponds to a state wherein the movable portion is lowered below the neutral position of the leaf spring 3, and the effective length e is determined by portions 31, 34 and so on as depicted by arrows. Thus, if required stroke is taken across the neutral point of the leaf spring, an error in size of portions that define the effective length e of the leaf spring 3 causes a change in attitude or posture of the movable portion. In consideration thereof, the required stroke should desirably be taken on one side only of the neutral position of the leaf spring 3.

Figure 7:
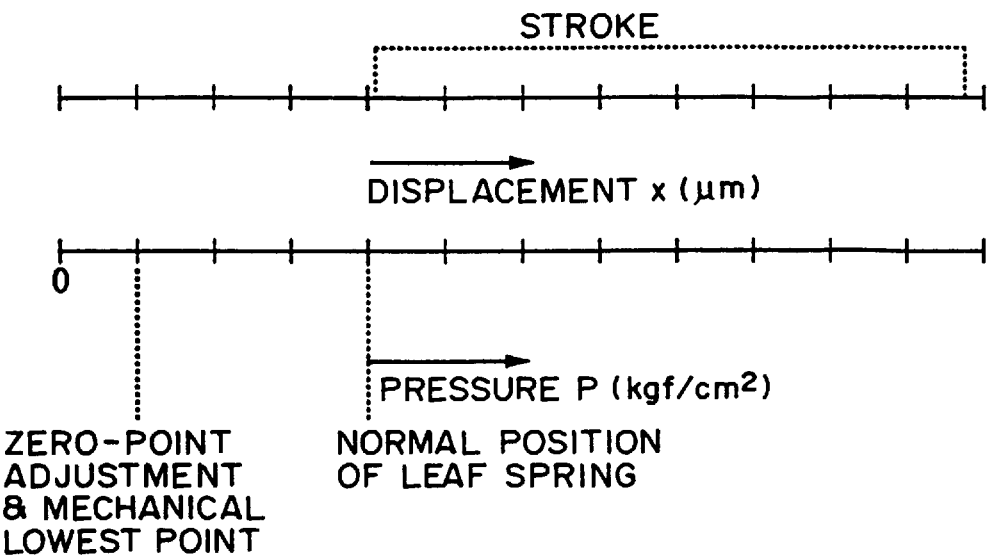
FIG. 7 is a schematic view for explaining the relation between the pressure within the driving element and displacement of a movable portion, in the mechanism of FIGS. 2A and 2B.

FIG. 7 shows the relation between pressure applied to the driving element 4 and displacement of the movable table 1. In this embodiment, the required stroke is taken from the position of the movable table 1 having moved above the neutral position of the leaf spring 3. Here, the relation between the pressure P and displacement X can be expressed as follows:

$$X = P \times A \times m/(i \times k)$$

where A is effective sectional area of the bellows 9, m is the number of the bellows 9 used, i is the number of leaf springs (elements) 3 used, and k is the spring constant of the leaf springs (elements) 3.

Figure 8:
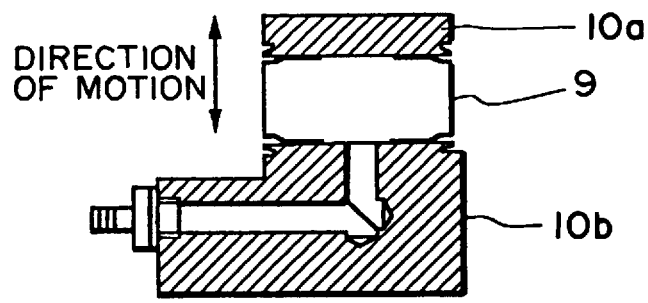
FIG. 8 is a sectional view of a driving element in the mechanism of FIGS. 2A and 2B.

FIG. 8 shows general structure of a driving element. The driving element 4 comprises a bellows 9 and two flanges 10a and 10b. One (10a) of the flanges extends, as described before, through a space between the leaf springs 3 and is connected to the clamping top plate 5, to move the movable table 1. The other flange 10b is placed within a notch 18 (see FIG. 2) formed in the fixed table 2, for reduction of thickness of the mechanism. Driving the movable table 1 is performed by controlling the pressure of fluid (pressurized air in this embodiment) so that the position where the pressure and the force of the leaf spring 3 are balanced is at a predetermined or desired position.

Referring back to FIGS. 2A and 2B, the cell 8 for supporting the adjusting lens 7 mounted to the movable table 1, is made separate from the movable table 1. This is to ensure that a reactive force applied thereto from the leaf spring in response to drive displacement does not cause distortion, for example, of the adjusting lens 7.

Figure 9A:
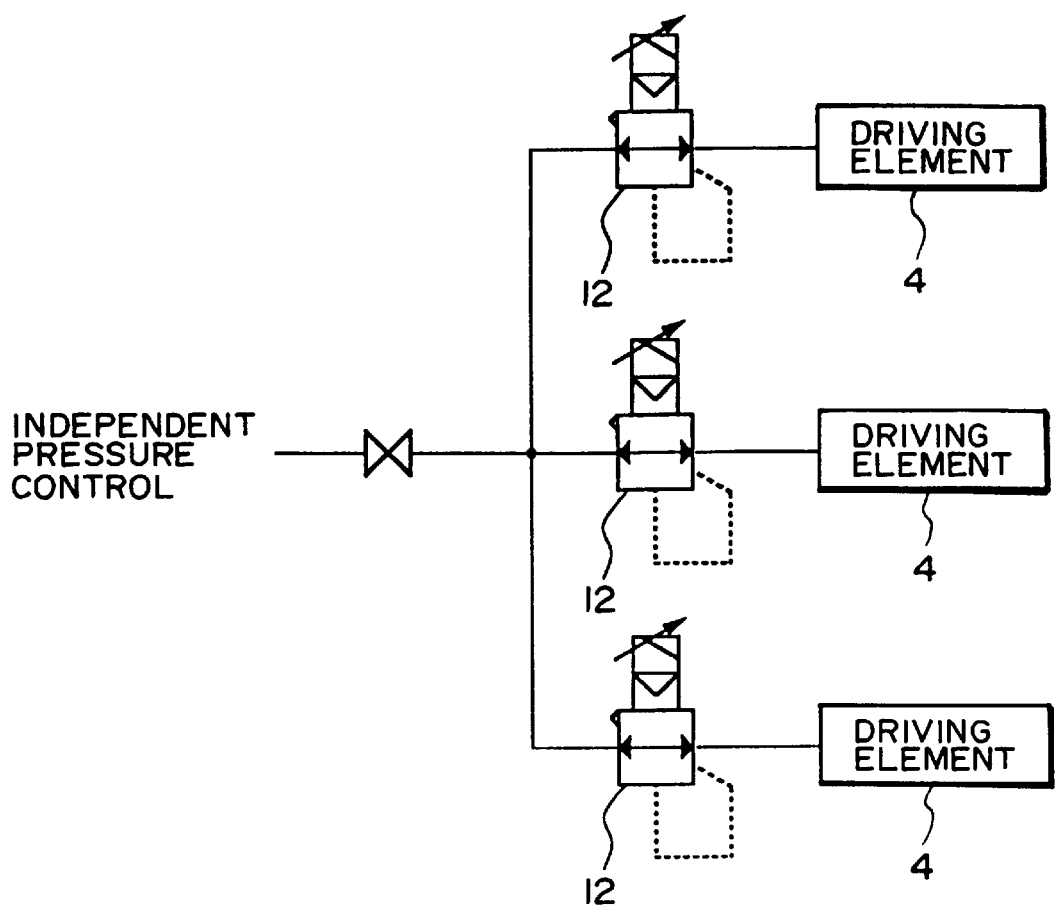
FIGS. 9A and 9B are diagrams for explaining the structure of a pneumatic pressure controlling system, of the mechanism of FIGS. 2A and 2B.

FIG. 9A shows the structure of a pneumatic pressure control for the driving element 4. Tilt correction of the movable portion is performed by controlling pressure valves 12 independently of each other. Each of the pressure control valves has a resolution sufficient for adjustment of magnification or aberration, for example, through the mechanism of this embodiment.

Referring back to FIG. 1, the projection optical system 104 of the exposure apparatus to which the present invention is applied, is mounted on the base (lower) 109 about the optical axis and in a direction advantageous in the point of optical characteristic. The combination of mounting is limited to n ways of the same number as of the number n of screw bores, in accordance with the spacing between screw positions for the mount of projection optical system, the screw positions being defined equidistantly around the optical axis.

In the optical component moving device 110 which is a part of the projection optical system 104, if it is so designed that the displacement sensor 13 (FIG. 2) can be mounted in any of n ways, the displacement sensor 13 can be placed constantly at a particular position in the exposure apparatus. This enables easy replacement or maintenance of the displacement sensor 13. Also, since it is possible to avoid forming the base (upper) 112 with many openings for maintenance of the optical component moving device 110, unwanted decrease of rigidity of the base (upper) 112 can be prevented.

Figure 10A:
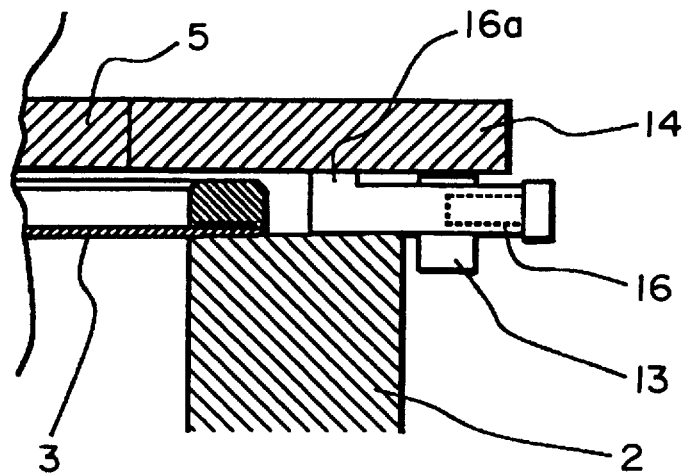
FIGS. 10A and 10B are sectional views for explaining details of a displacement sensor and a calibration system therefor, in the mechanism of FIGS. 2A and 2B.

FIG. 10A shows details of the displacement sensor 13 and a target plate 14. The target plate 14 is disposed opposed to the displacement sensor 13, and it is fixed to the clamping top plate 5. The displacement sensor 13 used comprises an electrostatic capacity displacement sensor, and it serves to measure the distance to the target plate 14 mounted to the clamping top plate 5. The displacement sensor 13 is fixedly mounted on the fixed table 2 by means of a sensor holder 16. The sensor holder 16 is provided with a contact-preventing protrusion 16a for preventing damage of the displacement sensor 13 by contact to the target plate 14. When as shown in FIG. 9A three driving elements 4 are controlled by means of three pressure control valves 12, the displacement sensor means may desirably comprise three displacement sensors 13. However, in this embodiment, in order to reduce the number of openings to be formed in the base (upper) 112 for maintenance of the displacement sensor 13, only one displacement sensor is used. Thus, the fluid pressure controlling system of this embodiment comprises a structure wherein three independent pressure controlling valves 12 are controlled on the basis of an output signal of one displacement sensor 13.

There is a possibility that the output signal of the displacement sensor 13 changes (drifts) with a change in temperature, for example. This leads to an error in magnification or aberration, for example. It is therefore desirable to perform absolute position correction. While such absolute position correction may be executed by adjustment based on actual exposure, the free position of the leaf spring 3, that is, a mechanical bottom point as the leaf spring is deformed downwardly due to weight of the movable portion, for example, when the pressure applied to the driving element 4 is reduced to zero, can be taken as a temporary origin.

Also, an abutment point, that is, the position where the movable portion is lowered and stopped by abutment to a protrusion, for example, may be taken as a mechanical bottom point. Since the mechanism as of this embodiment having freedom in the tilt direction shows a low rigidity in that tilt direction, three or more abutments may preferably be defined. For example, one abutment may be provided by the protrusion 16a on the sensor holder 16 and by the clamping top plate 5 such as shown in FIG. 10A, and the remaining two abutments may be provided by two balancing plates 17 (to be described later) and a protrusion formed on a locking plate 58 (FIG. 11) disposed opposed to the balancing plates 17. The mechanical bottom point may be checked by electrically isolating one of the two balancing plates 17 from the clamping top plate 5 and on the basis of electric conduction responsive to contact between that balancing plate 17 and the locking plate 58.

Figure 10B:
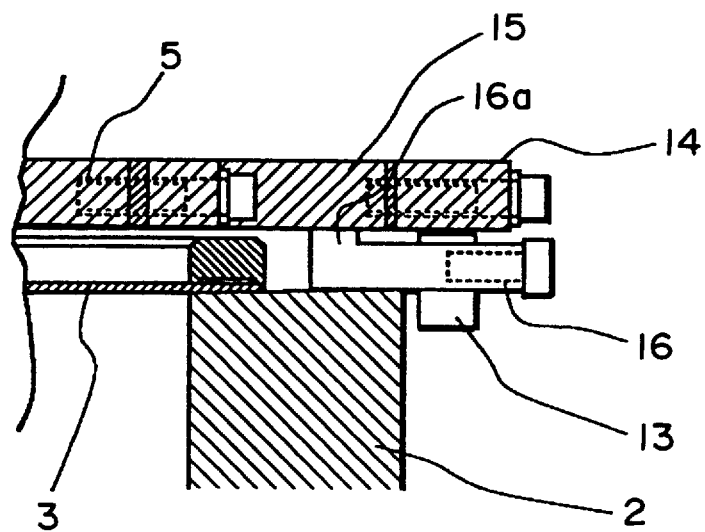

Alternatively, as shown in FIG. 10B, contact between the protrusion 16a of the sensor holder 16 and an origin point position detecting plate 15 connected with insulation to the clamping top plate 5 may be detected on the basis of electric conduction, and that position may be taken as a temporal origin for absolute position correction of the displacement sensor 13. In that occasion, since the force of contact between the protrusion 16a of the sensor holder 16 and the origin point position detecting plate 15 constantly balances with the weight of the movable portion and the resilient force of the leaf spring 3, higher detection precision is kept. When an electrostatic capacity displacement sensor is used as the displacement sensor 13 and if a common member is used as the target plate 14 and also as the origin point position detecting plate 15, there is a possibility that the displacement sensor 13 produces an erroneous output. It is therefore desirable that these components are provided by separate members.

For balancing the weight of the movable portion to meet the result of mounting the target plate 14 on the clamping top plate 5, as shown in FIG. 2A, two additional balancing plates 17 are mounted so that the gravity center of the movable portion is aligned with the optical axis. The balancing plates 17, target plate 14 and sensor holder 16 may function also as components of the locking mechanism that serves to prevent unwanted motion of the movable member during transportation.

Figure 11A:
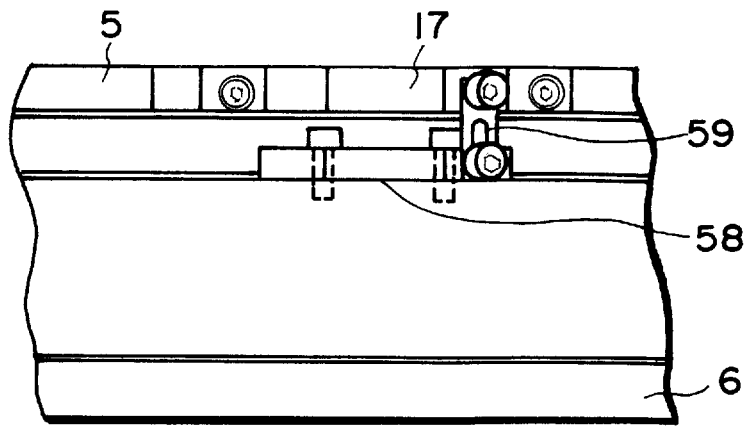
FIGS. 11A–11C are fragmentary views for explaining details of a locking mechanism, of the mechanism of FIGS. 2A and 2B.
Figure 11B:
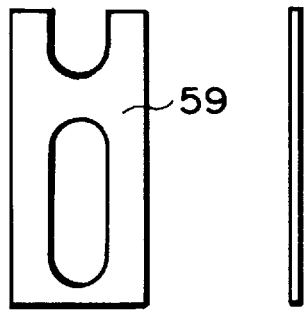
Figure 11C:
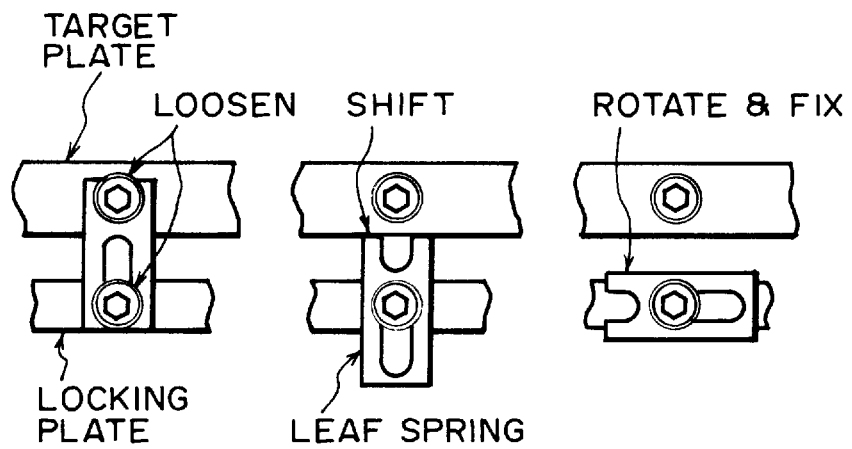

FIG. 11A shows details of the locking mechanism. The locking mechanism comprises a locking leaf spring 59 mounted between the target plate 14 and the sensor holder 16 or between the balancing plate 17 and a locking plate 58. Through tension rigidity and contraction rigidity thereof, unwanted motion of the movable portion is suppressed. As shown in FIG. 11B, the locking leaf spring 59 is formed with a U-shaped slit and an O-shaped slit. By loosening two fixing screws to allow sliding and rotating motion, as shown in FIG. 11C, the locking mechanism can be detached and re-mounted easily.

[Embodiment 2]

Figure 12A:
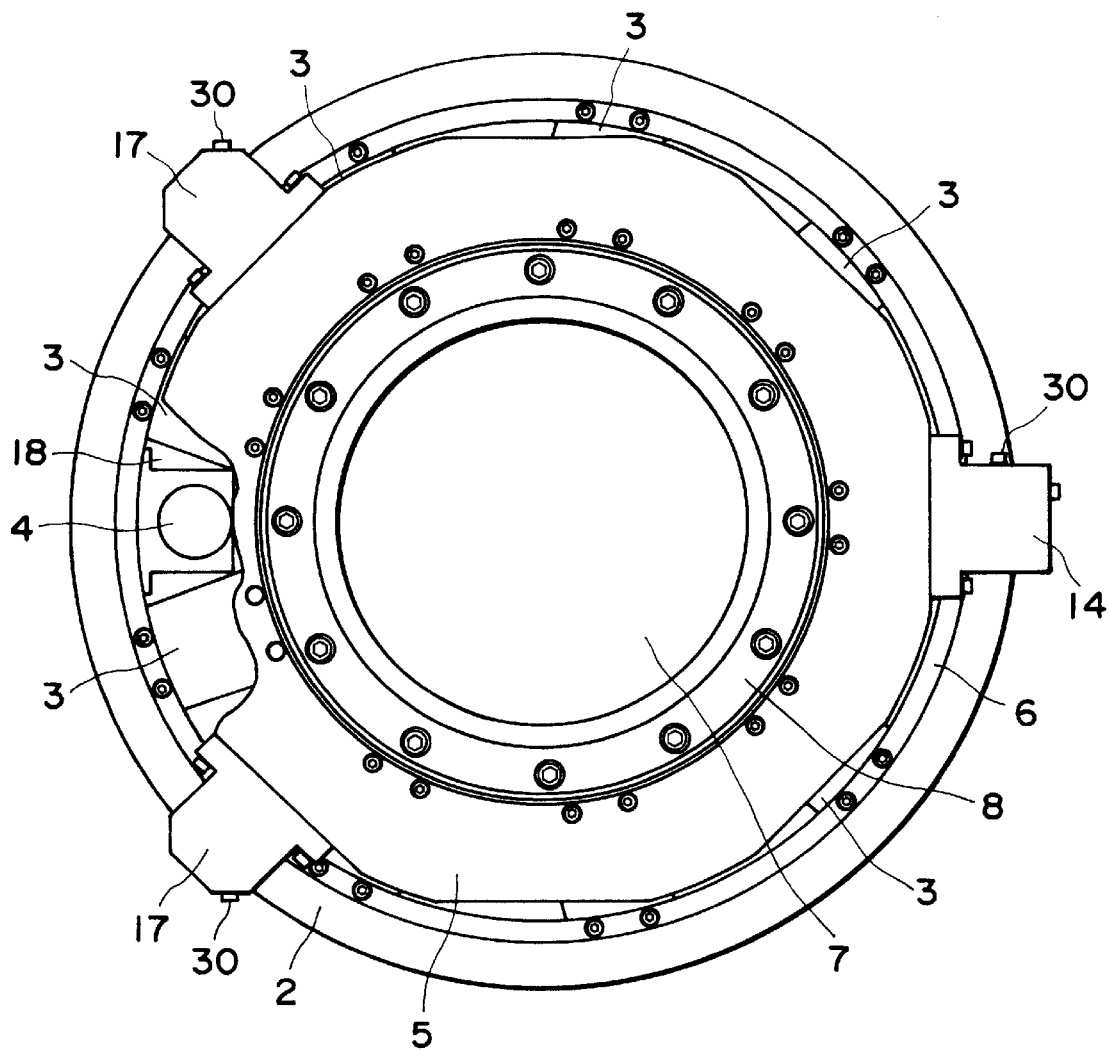
FIGS. 12A and 12B are a plan view and a sectional view of a parallel-spring type optical component moving mechanism, according to a second embodiment of the present invention.
Figure 12B:
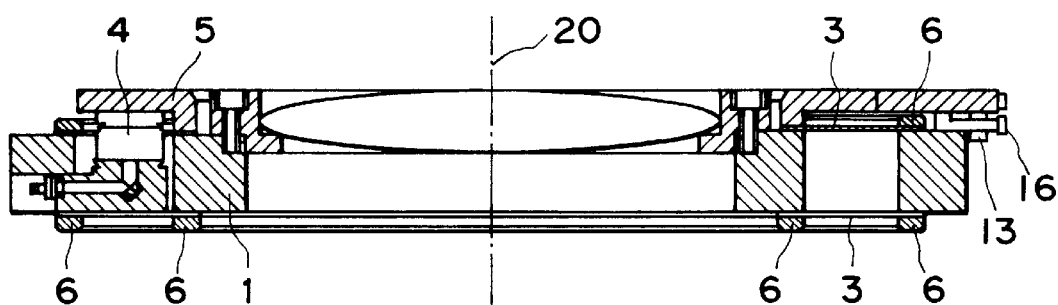

FIGS. 12A and 12B are a plan view and a sectional view of a parallel-spring type optical component moving mechanism according to a second embodiment of the present invention. The mechanism comprises a movable table 1 on which an adjusting lens 7 for adjustment of magnification or aberration, for example, and a cell 8 for supporting the lens 7, are mounted. The mechanism further includes a fixed table 2 which forms a part of a fixed portion of the projection optical system 104 of FIG. 1. Driving element 4 comprises a bellows, for example, and an end thereof is fixed to the fixed table 2. The other end thereof is fixed to a clamping top plate 5 which is coupled to the movable table 1. The movable table 1 and the fixed table 2 cooperate to provide a spring mechanism having pairs of two or more leaf springs 3 and a leaf spring keeper 6 for supporting the leaf springs. The pairs of leaf springs 3 are disposed at opposite end faces of the movable table 1 and the fixed table 2, respectively.

The parallel leaf spring mechanism as of this embodiment wherein drive is provided by tension of the leaf spring 3, can provides increased rigidity in the driving direction, such that a high natural vibration frequency is assured.

The driving element 4 used in the parallel spring mechanism in the form as of this embodiment wherein leaf springs 3 are disposed at outer circumference of the movable table 1 of cylindrical shape, should desirably satisfy the condition that drive is performed at a single central point of the movable table 1 or at those points which are symmetrical with respect to the optical axis 20, in the point of motion precision of the movable table 1. If the present invention is applied, however, in the former disposition the point corresponds to the optical axis 20. It is therefore difficult to set the driving point at that point. The former disposition should be preferably be selected.

On the other hand, a driving point closer to the optical axis 20 can reduce unwanted deformation of the clamping top plate 5 which connects the driving element 4 and the movable table 1. Also, in a case where the leaf spring means used in the parallel spring mechanism comprises plural leaf spring elements as in this embodiment, the driving element 4 can be placed in the space between adjacent leaf spring elements 3. This effectively saves the space. In this embodiment, as shown in FIG. 3A, the leaf spring means comprises nine leaf spring elements 3 at one side, that is, total eighteen leaf spring elements, and the driving point 4a is placed in the space between the leaf spring elements 3, being defined by trisection around the optical axis. In this example, a half of the number of leaf spring elements 3 (i.e., nine) and the number of driving elements 4 (i.e., three) are not mutually prime. As shown in FIGS. 3A–3C, if a half of the number of the leaf spring elements (i.e., four in FIG. 3B and six in FIG. 3C) and the number of the driving elements 4 are not mutually prime, the driving elements 4 can be placed in the spaces among the leaf spring elements 3, symmetrically with respect to the optical axis. The leaf spring elements 3 may desirably be connected into an integral structure, so that the problem of assembling positional precision is converted into the problem of machining precision.

Figure 5B:
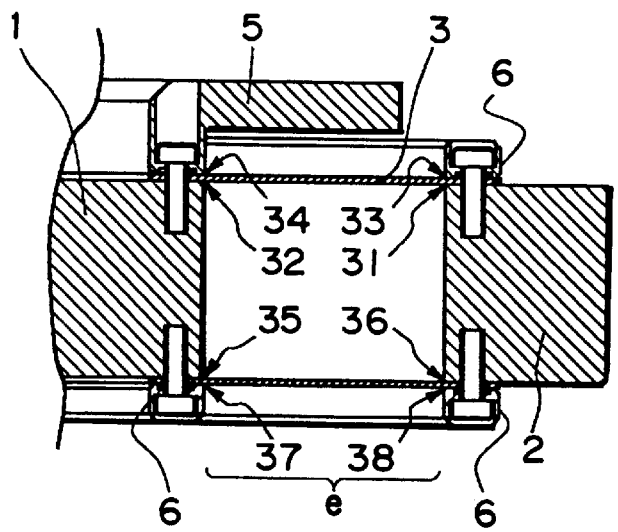

FIG. 4 is a sectional view showing details of the leaf spring keeper 6, and FIG. 5B is a sectional view showing details of the leaf springs 3 and leaf spring keeper 6. As shown in FIG. 5B, the leaf spring keeper 6 is connected to the fixed table 2 and to the movable table 1 by screws extending through bores formed in the leaf springs or spring elements 3. Each leaf spring keeper 6 does not serve to mount a single leaf spring. Rather, each leaf spring keeper 6 is formed into an annular shape in order that the leaf springs (elements) 3 have the same effective length e or that all the leaf springs (elements) 3 at one side are fixed at once. Also, the leaf spring keepers 6 have grooves formed in its surface contacting to the leaf springs 3 in order that the leaf springs are fixed uniformly as much as possible.

In the parallel spring mechanism of this embodiment, a difference in effective length e among the leaf spring elements affects the motion precision and assembling precision of the movable table 1. Therefore, high machining precision is required to an inside wall corners 31 and 36 of the fixed table 2, an outside wall corners 32 and 35 of the movable table 1, an inside wall corner 33 and 38 of the upper and lower leaf spring keepers 6 at the fixed table 2 side, an outside wall corner 34 of the clamping top plate 5 for holding leaf springs at the movable table 1 side and an inside wall corner 37 of the leaf spring keeper below the movable table 1, which determine the effective length e of the leaf spring. In the example of FIG. 5B, these corners 31–38 are normal. However, they may be formed into a uniform arcuate shape, so that concentration of stresses applied to the leaf spring 3 is reduced.

Exactly, however, there is a size error in portions of the leaf spring keeper 6, clamping top plate 5, movable table 1 and fixed table 2 which determine the effective length e of the leaf spring, that is, in the size of corners 31–38 described above. As a result, the effective member e changes if a member that defines the effective length e at above or below of the neutral position of the leaf spring 3 changes. FIGS. 6A and 6B show details of leaf spring fixation in a parallel spring mechanism wherein opposite side surfaces of the movable table 1 and the fixed table 2 are connected by means of leaf springs. FIG. 6A corresponds to a state wherein the movable portion is raised above the neutral position of the leaf spring 3. The effective length e of the leaf spring is determined by portions 32 and 33, and 37 and 36 as depicted by arrows. On the other hand, FIG. 6B corresponds to a state wherein the movable portion is lowered below the neutral position of the leaf spring 3, and the effective length e is determined by portions 31 and 34, and 35 and 38 as depicted by arrows. Thus, if required stroke is taken across the neutral point of the leaf spring, an error in size of portions that define the effective length e of the leaf spring 3 causes a change in attitude or posture of the movable portion. In consideration thereof, the required stroke should desirably be taken on one side only of the neutral position of the leaf spring 3.

FIG. 7 shows the relation between pressure applied to the driving element 4 and displacement of the movable table 1. In this embodiment, the required stroke is taken from the position of the movable table 1 having moved above the neutral position of the leaf spring 3. Here, the relation between the pressure P and displacement X can be expressed as follows:

$$X = P \times A \times m/(i \times k)$$

where A is effective sectional area of the bellows 9, m is the number of the bellows 9 used, i is the number of leaf springs (elements) 3 used, and k is the spring constant of the leaf springs (elements) 3.

FIG. 8 shows general structure of a driving element. The driving element 4 comprises a bellows 9 and two flanges 10a and 10b. One (10a) of the flanges extends, as described before, through a space between the leaf springs 3 and is connected to the clamping top plate 5, to move the movable table 1. The other flange 10b is placed within a notch 18 (see FIG. 12) formed in the fixed table 2, for reduction of thickness of the mechanism.

The movable table and the fixed table 2 have a basically cylindrical shape, and the opposite surfaces of them define the space for mounting the leaf springs of the parallel spring mechanism. Also, for suppressing tilt of the movable table during assembling, these surfaces are finished to provide the same flatness, parallelism and thickness.

The cell 8 for supporting the adjusting lens 7 mounted to the movable table 1, is made separate from the movable table 1. This is to ensure that a reactive force applied thereto from the leaf spring in response to drive displacement does not cause distortion, for example, of the adjusting lens 7.

Figure 9B:
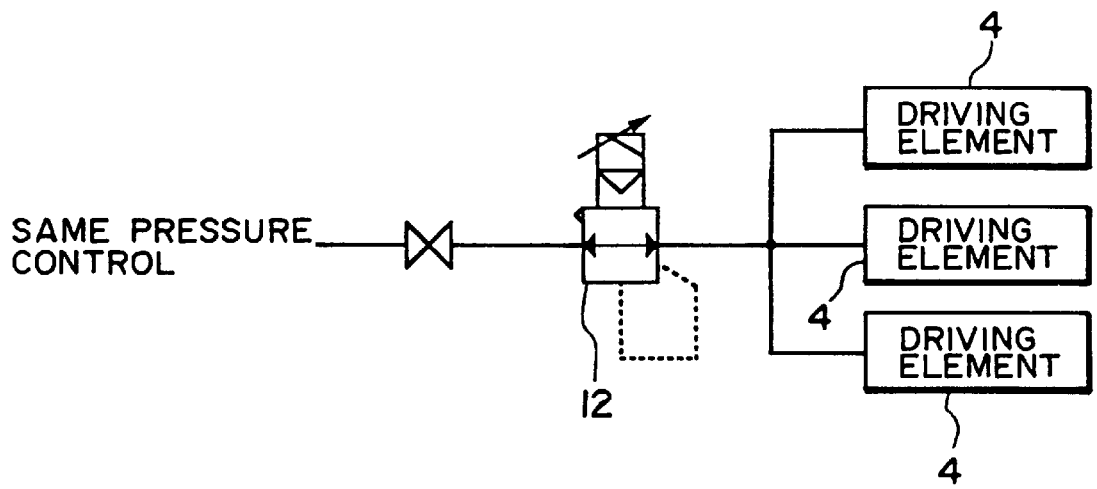

FIG. 9B shows the structure of a pneumatic pressure control for the driving element 4. The pressure control valve has a resolution sufficient for adjustment of magnification or aberration, for example, through the mechanism of this embodiment. In this embodiment, only one pressure controlling valve 12 is used. The output of this pressure controlling valve 12 is branched by a manifold, for example, into a number corresponding to the number of the driving elements 4 (i.e., three). As a matter of course, pressure controlling valves of a number corresponding to the number of the driving elements 4 may be used, such as shown in FIG. 9A.

Referring back to FIG. 1, the projection optical system 104 of the exposure apparatus to which the present invention is applied, is mounted on the base (lower) 109 about the optical axis and in a direction advantageous in the point of optical characteristic. The combination of mounting is limited to n ways of the same number as of the number n of screw bores, in accordance with the spacing between screw positions for the mount of projection optical system, the screw positions being defined equidistantly around the optical axis.

In the optical component moving device 110 which is a part of the projection optical system 104, if it is so designed that the displacement sensor 13 (FIG. 2) can be mounted in any of n ways, the displacement sensor 13 can be placed constantly at a particular position in the exposure apparatus. This enables easy replacement or maintenance of the displacement sensor 13. Also, since it is possible to avoid forming the base (upper) 112 with many openings for maintenance of the optical component moving device 110, unwanted decrease of rigidity of the base (upper) 112 can be prevented.

FIG. 10A shows details of the displacement sensor 13 and a target plate 14. The target plate 14 is disposed opposed to the displacement sensor 13, and it is fixed to the clamping top plate 5. The displacement sensor 13 is fixedly mounted to the fixed table 2 by means of a sensor holder 16. The displacement sensor 13 used comprises an electrostatic capacity displacement sensor, and it serves to measure the distance to the target plate 14 mounted to the clamping top plate 5. The sensor holder 16 is provided with a contact-preventing protrusion 16a for preventing damage of the displacement sensor 13 by contact to the target plate 14. When as shown in FIG. 9B three driving elements 4 are controlled by means of three pressure control valves 12, the displacement sensor means may desirably comprise only one displacement sensor 13. If however three driving elements 4 are controlled by using three pressure controlling valves 12 as shown in FIG. 9A, three displacement sensors 13 may preferably be used.

There is a possibility that the output signal of the displacement sensor 13 changes (drifts) with a change in temperature, for example. This leads to an error in magnification or aberration, for example. It is therefore desirable to perform absolute position correction. While such absolute position correction may be executed by adjustment based on actual exposure, the free position of the leaf spring 3 can be taken as a temporary origin.

Alternatively, as shown in FIG. 10B, contact between the protrusion 16a of the sensor holder 16 and an origin point position detecting plate 15 connected with insulation to the clamping top plate 5 may be detected on the basis of electric conduction, and that position may be taken as a temporal origin for absolute position correction of the displacement sensor 13. In that occasion, since the force of contact between the protrusion 16a of the sensor holder 16 and the origin point position detecting plate 15 constantly balances with the weight of the movable portion and the resilient force of the leaf spring 3, higher detection precision is kept. When an electrostatic capacity displacement sensor is used as the displacement sensor 13 and if a common member is used as the target plate 14 and also as the origin point position detecting plate 15, there is a possibility that the displacement sensor 13 produces an erroneous output. It is therefore desirable that these components are provided by separate members. Further, since in the case of parallel spring mechanism as of this embodiment the rigidity in the tilt direction is high, one origin point position reproducing mechanism may desirably be used so as to prevent insufficient contact between the protrusion 16a and the origin point position detecting plate 15 due to an error in size of the abutment portion, for example.

For balancing the weight of the movable portion to meet the result of mounting the target plate 14 on the clamping top plate 5, two additional balancing plates 17 are mounted so that the gravity center of the movable portion is aligned with the optical axis. The balancing plates 17, target plate 14 and sensor holder 16 may function also as components of the locking mechanism that serves to prevent unwanted motion of the movable member during transportation.

FIG. 11A shows details of the locking mechanism. The locking mechanism comprises a locking leaf spring 59 mounted between the target plate 14 and the sensor holder 16 or between the balancing plate 17 and a locking plate 58. Through tension rigidity and contraction rigidity thereof, unwanted motion of the movable portion is suppressed. As shown in FIG. 11B, the locking leaf spring 59 is formed with a U-shaped slit and an O-shaped slit. By loosening two fixing screws to allow sliding and rotating motion, as shown in FIG. 11C, the locking mechanism can be detached and re-mounted easily.

[Embodiment 3]

Figure 13A:
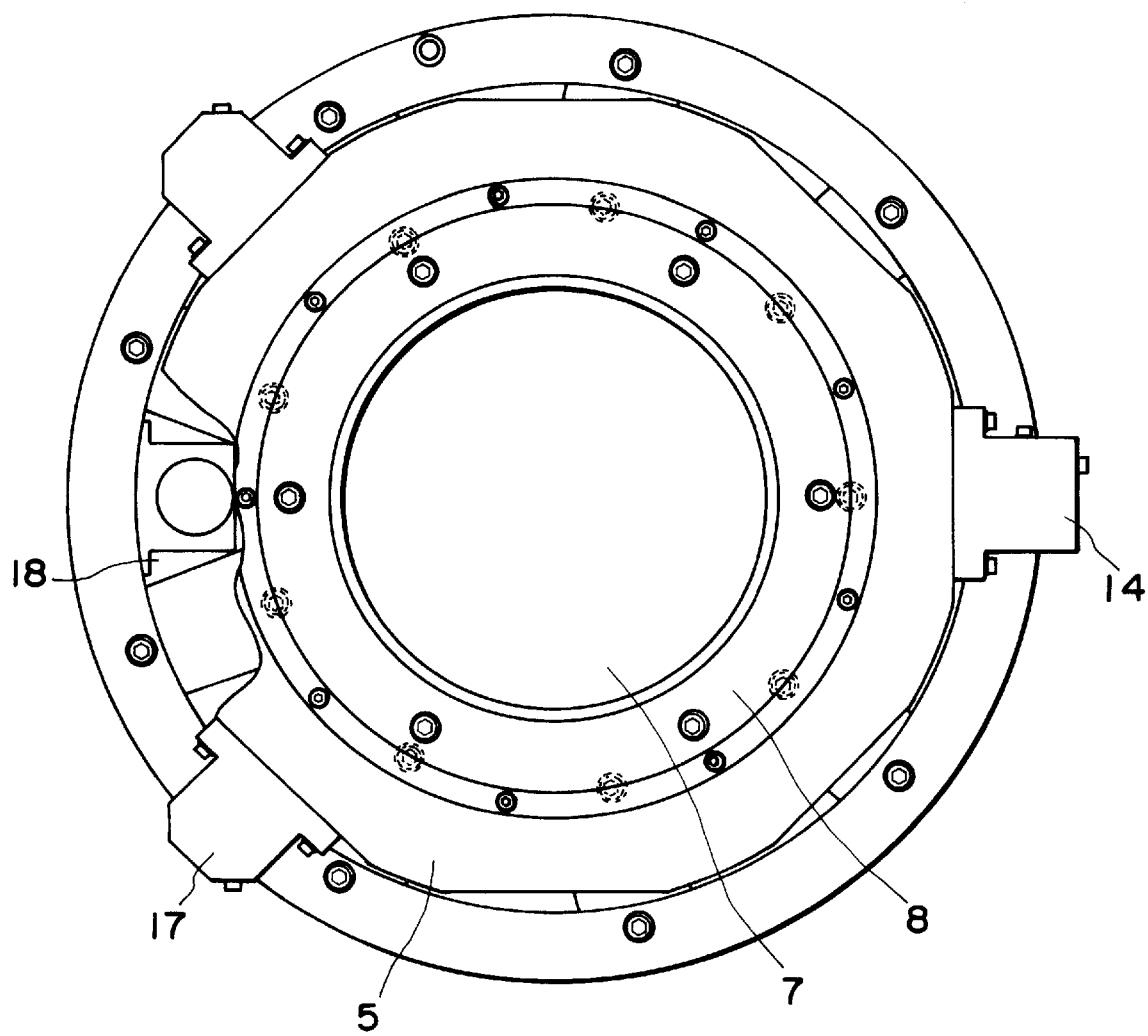
FIGS. 13A and 13B are a plan view and a sectional view of an integral-type optical component moving mechanism, according to a third embodiment of the present invention.
Figure 13B:
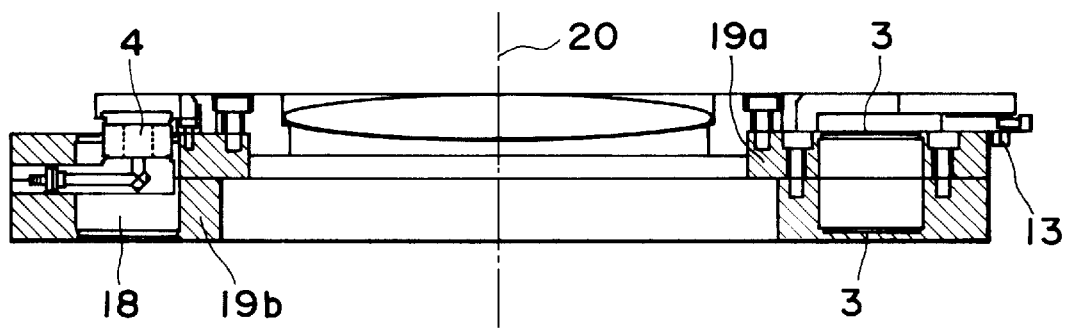

FIGS. 13A and 13B are a plan-view and a sectional view of an integral-type optical element moving mechanism according to a third embodiment of the present invention. The mechanism of this embodiment comprises leaf springs 3, a movable table 1 and a fixed table 2 which are formed into an integral blank, more specifically, upper and lower parallel spring blanks 19a and 19b. Adjusting lens 7 for adjustment of magnification or aberration, for example, cell 8 for supporting the lens, driving element 4 comprising a bellows 9, and clamping top plate 5 have similar structures as of those of the second embodiment.

The parallel spring mechanism provided by two blanks 19a and 19b is more effective as compared with a parallel spring mechanism provided by combining leaf springs 3, movable table1 and fixed table 2, in the points of tilt of movable portion due to warping of leaf spring or to an assembling error, of effect of temperature distortion due to difference in materials, or of assembling precision control.

The parallel spring mechanism as of this embodiment wherein driving is based on tension of the leaf spring 3, is effective to provide increased rigidity in the driving direction and, as a result, higher natural vibration frequency is assured.

The driving element 4 used in the parallel spring mechanism in the form as of this embodiment wherein leaf springs 3 are disposed at outer circumference of the movable table 1 of cylindrical shape, should desirably satisfy the condition that drive is performed at a single central point of the movable table 1 or at those points which are equidistant from the center and are symmetrical with respect to the optical axis 20, in the point of motion precision of the movable table 1. If the present invention is applied, however, in the former disposition the point corresponds to the optical axis 20. It is therefore difficult to set the driving point at that point. The former disposition should be preferably be selected.

On the other hand, a driving point closer to the optical axis 20 can reduces unwanted deformation of the clamping top plate 5 which connects the driving element 4 and the movable table 1. Also, in a case where the leaf spring means used in the parallel spring mechanism comprises plural leaf spring elements as in this embodiment, the driving element 4 can be placed in the space between adjacent leaf spring elements 3. This effectively saves the space. In this embodiment, as shown in FIG. 3A, the leaf spring means comprises nine leaf spring elements 3 at one side, that is, total eighteen leaf spring elements, and the driving point 4a is placed in the space between the leaf spring elements 3, being defined by trisection around the optical axis. In this example, a half of the number of leaf spring elements 3 (i.e., nine) and the number of driving elements 4 (i.e., three) are not mutually prime. As shown in FIGS. 3A–3C, if a half of the number of the leaf spring elements (i.e., four in FIG. 3B and six in FIG. 3C) and the number of the driving elements 4 are not mutually prime, the driving elements 4 can be placed in the spaces among the leaf spring elements 3, symmetrically with respect to the optical axis.

FIG. 8 shows general structure of a driving element. The driving element 4 comprises a bellows 9 and two flanges 10a and 10b. One (10a) of the flanges extends, as described before, through a space between the leaf springs 3 and is connected to the clamping top plate 5, to move the movable table 1. The other flange 10b is placed within a notch 18 (see FIG. 12) formed in one or or each of the two blanks 19a and 19b.

The cell 8 for supporting the adjusting lens 7 mounted to the movable table 1, is made separate from the movable table 1. This is to ensure that a reactive force applied thereto from the leaf spring in response to drive displacement does not cause distortion, for example, of the adjusting lens 7.

FIG. 9B shows the structure of a pneumatic pressure control for the driving element 4. The pressure control valve 12 has a resolution sufficient for adjustment of magnification or aberration, for example, through the mechanism of this embodiment. In this embodiment, only one pressure controlling valve 12 is used. The output of this pressure controlling valve 12 is branched by a manifold, for example, into a number corresponding to the number of the driving elements 4 (i.e., three in this embodiment). As a matter of course, pressure controlling valves of a number corresponding to the number of the driving elements 4 may be used, such as shown in FIG. 9A.

Referring back to FIG. 1, the projection optical system 104 of the exposure apparatus to which the present invention is applied, is mounted on the base (lower) 109 about the optical axis and in a direction advantageous in the point of optical characteristic. The combination of mounting is limited to n ways of the same number as of the number n of screw bores, in accordance with the spacing between screw positions for the mount of projection optical system, the screw positions being defined equidistantly around the optical axis.

In the optical component moving device 110 which is a part of the projection optical system 104, if it is so designed that the displacement sensor 13 can be mounted in any of n ways, the displacement sensor 13 can be placed constantly at a particular position in the exposure apparatus. This enables easy replacement or maintenance of the displacement sensor 13. Also, since it is possible to avoid forming the base (upper) 112 with many openings for maintenance of the optical component moving device 110, unwanted decrease of rigidity of the base (upper) 112 can be prevented.

FIG. 10A shows details of the displacement sensor 13 and a target plate 14. The target plate 14 is disposed opposed to the displacement sensor 13, and it is fixed to the clamping top plate 5. The displacement sensor 13 is fixedly mounted to the fixed table 2 by means of a sensor holder 16. The displacement sensor 13 used comprises an electrostatic capacity displacement sensor, and it serves to measure the distance to the target plate 14 mounted to the clamping top plate 5. The sensor holder 16 is provided with a contact-preventing protrusion 16a for preventing damage of the displacement sensor 13 by contact to the target plate 14. When as shown in FIG. 9B three driving elements 4 are controlled by means of a single pressure control valve 12, the displacement sensor means may desirably comprise only one displacement sensor 13. If however three driving elements 4 are controlled by using three pressure controlling valves 12 as shown in FIG. 9A, three displacement sensors 13 may preferably be used.

There is a possibility that the output signal of the displacement sensor 13 changes (drifts) with a change in temperature, for example. This leads to an error in magnification or aberration, for example. It is therefore desirable to perform absolute position correction. While such absolute position correction may be executed by adjustment based on actual exposure, the free position of the leaf spring 3 can be taken as a temporary origin.

Alternatively, as shown in FIG. 10B, contact between the protrusion 16a of the sensor holder 16 and an origin point position detecting plate 15 connected with insulation to the clamping top plate 5 may be detected on the basis of electric conduction, and that position may be taken as a temporal origin for absolute position correction of the displacement sensor 13. In that occasion, since the force of contact between the protrusion 16a of the sensor holder 16 and the origin point position detecting plate 15 constantly balances with the weight of the movable portion and the resilient force of the leaf spring 3, higher detection precision is kept. When an electrostatic capacity displacement sensor is used as the displacement sensor 13 and if a common member is used as the target plate 14 and also as the origin point position detecting plate 15, there is a possibility that the displacement sensor 13 produces an erroneous output. It is therefore desirable that these components are provided by separate members. Further, since in the case of parallel spring mechanism as of this embodiment the rigidity in the tilt direction is high, one origin point position reproducing mechanism may desirably be used so as to prevent insufficient contact between the protrusion 16a and the origin point position detecting plate 15 due to an error in size of the abutment portion, for example.

For balancing the weight of the movable portion to meet the result of mounting the target plate 14 on the clamping top plate 5, two additional balancing plates 17 are mounted so that the gravity center of the movable portion is aligned with the optical axis. The balancing plates 17, target plate 14 and sensor holder 16 may function also as components of the locking mechanism that serves to prevent unwanted motion of the movable member during transportation.

FIG. 11A shows details of the locking mechanism. The locking mechanism comprises a locking leaf spring 59 mounted between the target plate 14 and the sensor holder 16 or between the balancing plate 17 and a locking plate 58. Through tension rigidity and contraction rigidity thereof, unwanted motion of the movable portion is suppressed. As shown in FIG. 11B, the locking leaf spring 59 is formed with a U-shaped slit and an O-shaped slit. By loosening two fixing screws to allow sliding and rotating motion, as shown in FIG. 11C, the locking mechanism can be detached and re-mounted easily.

FIG. 7 shows the relation between pressure applied to the driving element 4 and displacement of the movable table 1. In this embodiment, the required stroke is taken from the position of the movable table 1 having moved above the neutral position of the leaf spring 3. Here, the relation between the pressure P and displacement X can be expressed as follows:

$$X = P \times A \times m / (i \times k)$$

where A is effective sectional area of the bellows 9, m is the number of the bellows 9 used, i is the number of leaf springs (elements) 3 used, and k is the spring constant of the leaf springs (elements) 3.

[Embodiment 4]

Figure 14:
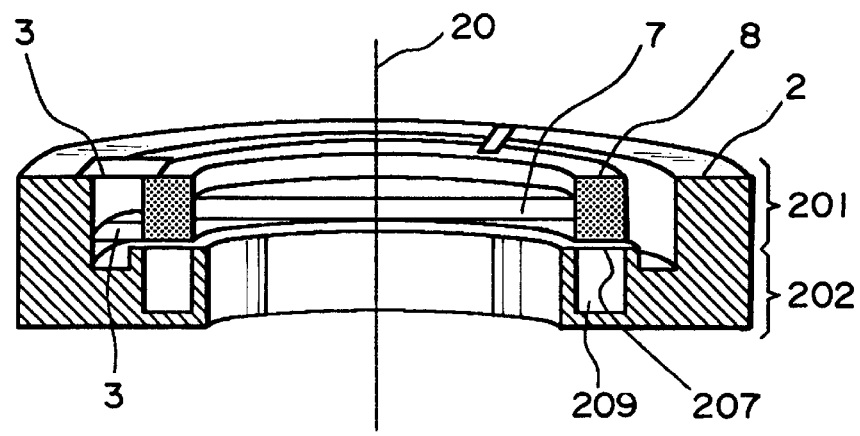
FIG. 14 is a perspective view, partially in section, of an optical component moving mechanism according to a fourth embodiment of the present invention.
Figure 15:
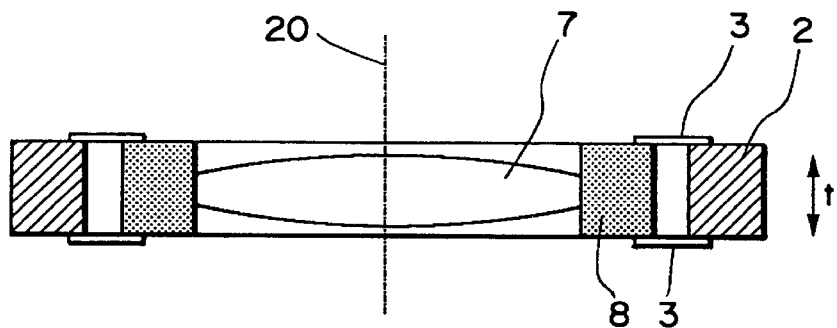
FIG. 15 is is a sectional view of a parallel spring motion guide, in the mechanism of FIG. 14.

FIG. 14 is a perspective view with section, of an optical component moving mechanism according to a fourth embodiment of the present invention. The mechanism comprises a movable portion 201 and a driving portion 202. The movable portion 201 includes parallel springs 3, a flange portion (outer ring) 2 and a cell 8 coupled to each other through parallel spring motion guide by the parallel springs 3. Denoted at 7 is an adjusting lens mounted on the cell 8. FIG. 15 illustrates that the cell 8 is coupled to the flange 2 through parallel spring motion guide by the parallel springs 3. On the other hand, the driving portion 202 comprises an annular diaphragm 207 and the flange 2 such that any deformation of the annular diaphragm 207 due to a change in pressure or volume of a fluid 209 such as an air causes an output displacement of the driving portion 202, that is, an input displacement of the movable portion 201.

Figures 16A, 16B:
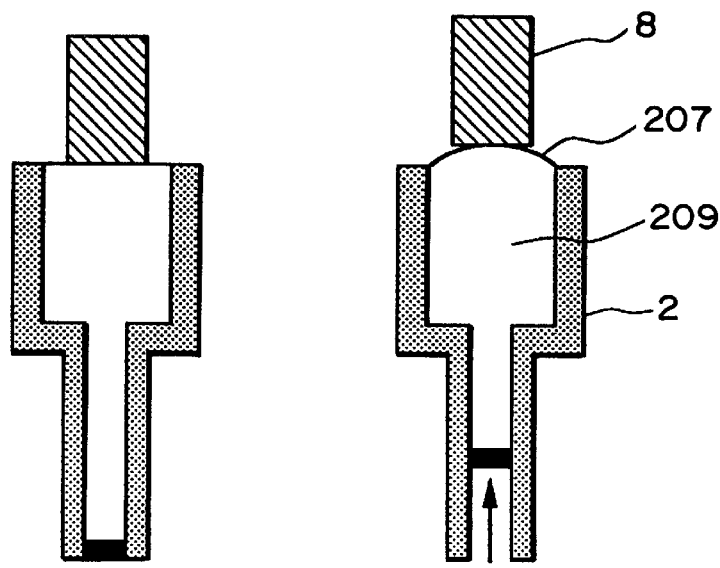
FIGS. 16A and 16B are sectional views for explaining operation of a driving portion, in the mechanism of FIG. 14.

FIGS. 16A and 16B show driving of the cell 8 by the driving portion 202. FIG. 16A illustrates a state in which the volume of the fluid 209 between the annular diaphragm 207 and the flange 2 is large, and FIG. 16B illustrates a state in which the volume of that fluid 209 is small.

Figure 17A:
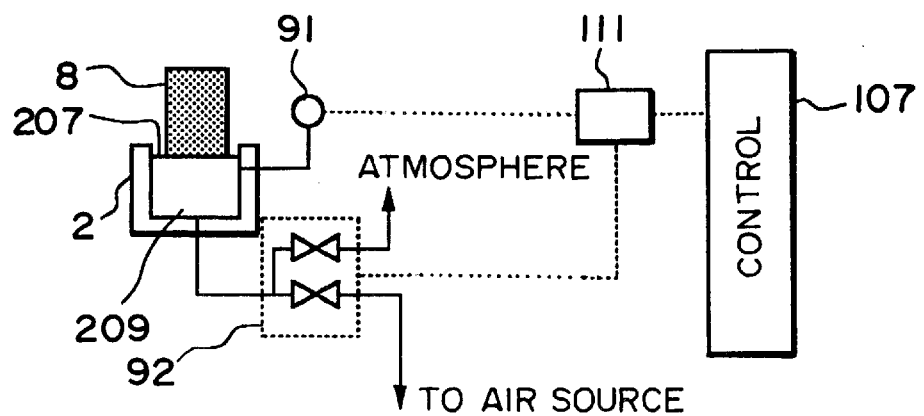
FIGS. 17A–17C are diagrams of means for suppressing the driving portion of the mechanism of FIG. 14.

Generally, there are two method for displacing a diaphragm or bellows by a desired amount. A first method is that a gas (compressible fluid) such as an air is used and the pressure of the diaphragm is controlled so that the pressure of the fluid inside the diaphragm balances with the spring force in the displacement direction of the driving system. The spring force in the displacement direction of the driving system may be provided by a resilient member (guide means) to be described later or a diaphragm member which serves to sealingly enclose the fluid. With this method, it is difficult that the rigidity of the fluid attributes as the rigidity in the driving direction. However, the handling is easy and the structure is simple. FIG. 17A shows an example of structure according to this method. In this example, the pressure of the fluid 209 such as air in the portion enclosed by the diaphragm 207 and the flange 2 is measured by a pressure gauge 91, and it is controlled to a predetermined pressure by means of controlling valves 92. The controller 107 has a function for correlating the pressure of the fluid 209 with the position of the lens, stored therein beforehand. The controlling valve 92 is controlled so as to produce a pressure in the fluid 209 which corresponds to the lens position as determined in accordance with this relation.

Figure 17B:
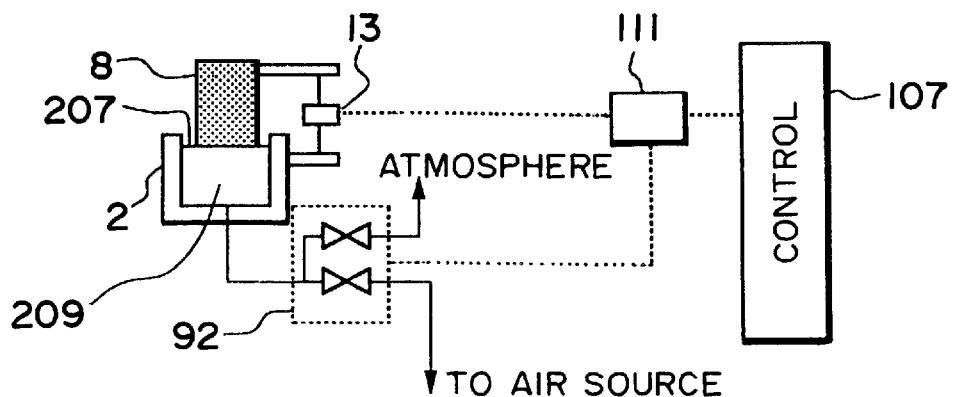

FIG. 17B shows another example according to this method. In this example, the position of the lens is measured by means of a position sensor 13 such as a linear encoder, for example. The controller 17 controls the controlling valves 12 so that the output of the position sensor 13 becomes equal to a specified value.

Figure 17C:
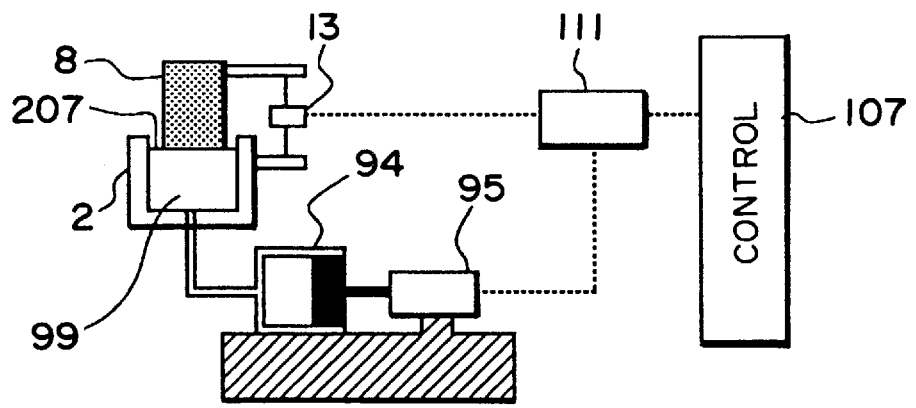

A second method is a method which uses a fluid (non-compressible fluid) such as an oil. FIG. 17C shows an example according to this method. In this example, a diaphragm portion enclosed by a diaphragm 207 and a flange 2, a cylinder chamber 94 and piping means connecting them are filled with a fluid 99. The cylinder chamber 94 comprises a piston and cylinder assembly coupled to a linear motion actuator 95. The position of the lens is measured by a position sensor 13. The controller 17 controls the linear motion actuator 95 so that the output of the sensor 13 becomes equal to a specified value, and a fluid of a predetermined amount is supplied from the cylinder chamber 94 into the diaphragm portion. In this example, the rigidity of fluid much contributes to the rigidity in the driving direction. Thus, there is an advantage that a large rigidity in the driving direction is provided without using a guide spring member having large rigidity.

On the other hand, in the parallel spring mechanism which guides the motion such as shown in FIG. 15, in order to prevent tilt error, the interval t between mounting positions of the parallel springs 3 should be made large. In order to shorten this interval t, it is necessary that a force or displacement is applied uniformly to the circumference of the cell 8.

With the structure of the driving portion 202 shown in FIG. 14, the cell 8 can be driven by the annular diaphragm 207 over the whole circumference thereof. Thus, even if the interval t between the mounting positions of the parallel springs 3 is short, parallel or translational eccentricity or tilt error of the cell can be made small. This is very effective to reduce the thickness of the unit as a whole.

The structure of such parallel spring mechanism can be provided by two sets of three parallel springs 3, of a total number six, such as shown in FIG. 18A. In this structure, however, displacement of the movable portion 201 is provided by elongation of the leaf spring 3. Thus, there occurs non-linear relation between the input and output displacement. Also, a large driving force is required. In order to solve such problem, two annular leaf springs 3 such as shown in FIG. 18B, constraining the whole circumference, may be used. However, like the case of FIG. 18A, displacement is provided by elongation of the spring. In consideration of this, a structure having corrugation or having a circumferential slit (FIG. 18C) may be used. Alternatively, as shown in FIG. 18D, a structure wherein slits inclined with respect to a radial direction and each having circular bores at opposite ends thereof may be used so that elongation of an annular spring 3 may be prevented through rotation. In that occasion, the rigidity of the leaf spring 3 can be substantially reduced by widening the width of the slit. Thus, the width of the annular leaf spring 3 can be reduced, this being effective to save the space.

In place of using the annular leaf spring 3 as described, two sets of three folded leaf springs 3 such as shown in FIG. 18E or element springs 3 such as shown in FIG. 18F, of a total number six, may be used. Also, these structures are effective in reduction of space.

[Embodiment 5]

Figure 19:
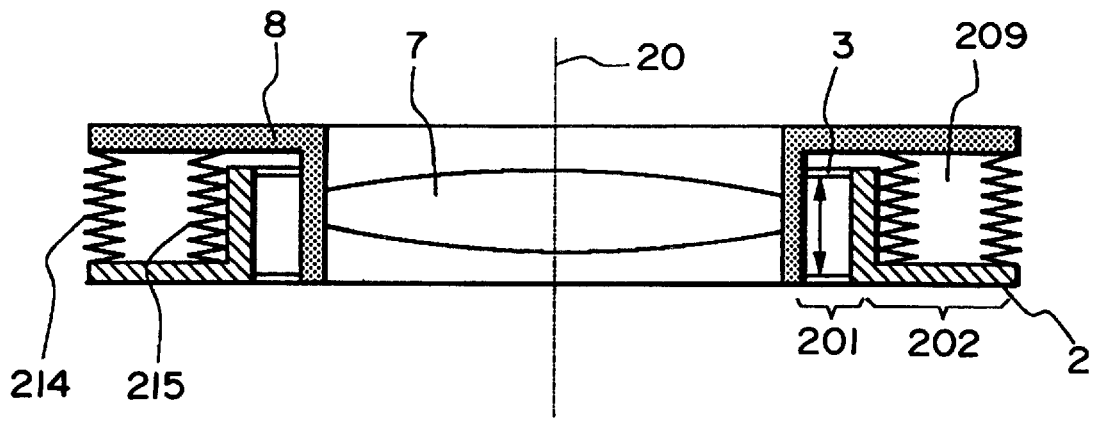
FIG. 19 is a sectional view of an optical component moving mechanism according to a fifth embodiment of the present invention.

FIG. 19 is a sectional view of an optical component moving mechanism according to a fifth embodiment of the present invention. The mechanism comprises a movable portion 201 and a driving portion 202. The movable portion 202 includes parallel springs 3, a flange (fixed portion) and a cell 8 coupled to each other through parallel spring motion guide by the parallel springs. Denoted at 7 is an adjusting lens mounted on the cell 8. The parallel or translational eccentricity and tilt error thereof corresponds to those of the cell 8. On the other hand, the driving portion 202 is so arranged that output displacement is produced by a change in volume of a fluid 209 such as air or oil, enclosed by the cell 8, the flange 2 and two bellows 214 and 215 which are superposedly and concentrically disposed.

Generally, a change in pressure of a fluid can be produced by a combination of a functional element for holding the fluid by using a cylinder or bellows and for causing a change in volume of the thus held fluid, with an actuator such as a motor for causing displacement for changing the volume of that functional element.

In the structure of the driving means 202 of this embodiment, the cell 8 can be driven over the entire circumference thereof by means of the two bellows 214 and 215 which are concentrically and superposedly disposed. Thus, even if the interval t between the mounting positions of the parallel springs 3 is short, the translational eccentricity and tilt error of the cell 8 can be made small. This effectively reduces the thickness of the unit as a whole. In the method in which the cell is driven over the entire circumference by means of the two bellows 214 and 215 concentrically and superposedly disposed, there is no rigidity in the radial direction. In consideration thereof, the structure is provided with both of guiding element and driving element.

As regards the structure of parallel spring 3, what having been explained with reference to the fourth embodiment in conjunction with FIG. 18 applies.

[Embodiment 6]

Figure 20:
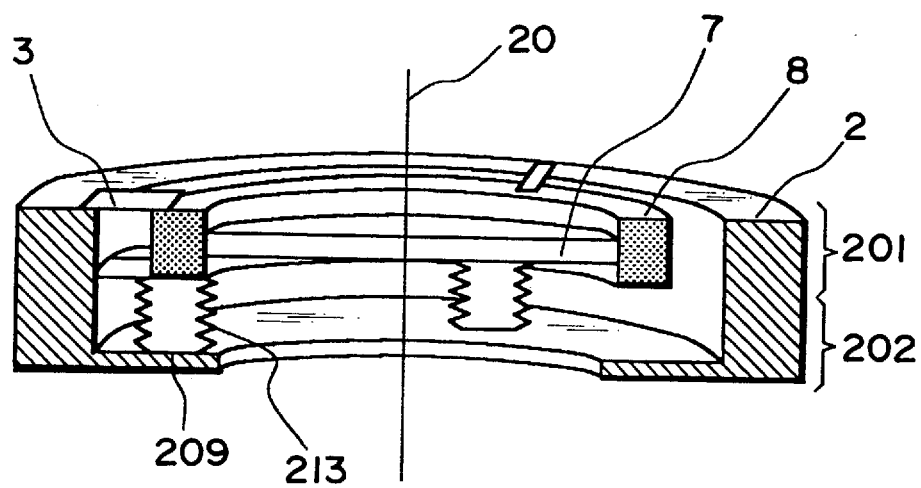
FIG. 20 is a sectional view of an optical component moving mechanism according to a sixth embodiment of the present invention.

FIG. 20 is a perspective view, with section, of an optical component moving mechanism according to a sixth embodiment of the present invention. The mechanism comprises a movable portion 201 and a driving portion 202 which are stacked along the optical axis direction, as in the fourth embodiment. The movable portion 202 includes parallel springs 3, a flange 2 portion (outer ring) and a cell 8 portion coupled to each other through parallel spring motion guide by the parallel springs. Denoted at 7 is an adjusting lens mounted on the cell 8. The parallel or translational eccentricity and tilt error thereof corresponds to those of the cell 8. On the other hand, the driving portion 202 is so arranged that output displacement is produced by a change in volume of a fluid 209 such as air or oil, enclosed by the cell 8, the flange 2 and plural bellows 213 which are placed at equidistant points along the circumferential direction.

Generally, a change in pressure of a fluid can be produced by a combination of a functional element for holding the fluid by using a cylinder or bellows and for causing a change in volume of the thus held fluid, with an actuator such as a motor for causing displacement for changing the volume of that functional element.

In the structure of the driving means 202 of this embodiment, a difference in output displacement among plural bellows 213 causes tilt eccentricity of the adjusting lens 7. However, by applying the same pressure to these bellows 213, a high-precision driving element is provided. More specifically, the pipings for fluids 209 within these bellows may be connected to a single fluid pressure controlling system or fluid volume controlling system. This makes it possible to provide the same pressure within these bellows 213, such that, except an effect of a difference in shape of these bellows 213, the bellows 213 can produce the same driving force. It is therefore possible to suppress tilt eccentricity during the motion.

As regards the structure of parallel spring 3, what having been explained with reference to the fourth embodiment in conjunction with FIG. 18 applies.

[Embodiment 7]

Figure 21:
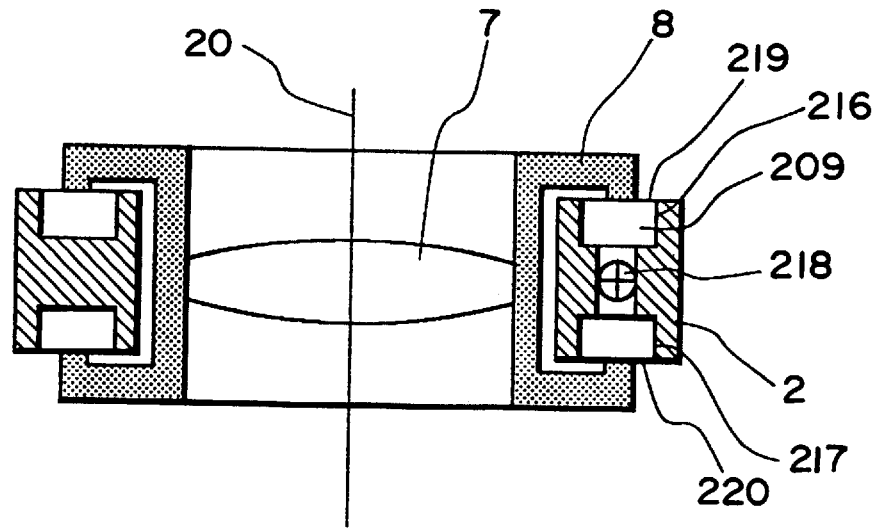
FIG. 21 is a sectional view of an optical component moving mechanism according to a seventh embodiment of the present invention.
Figure 22:
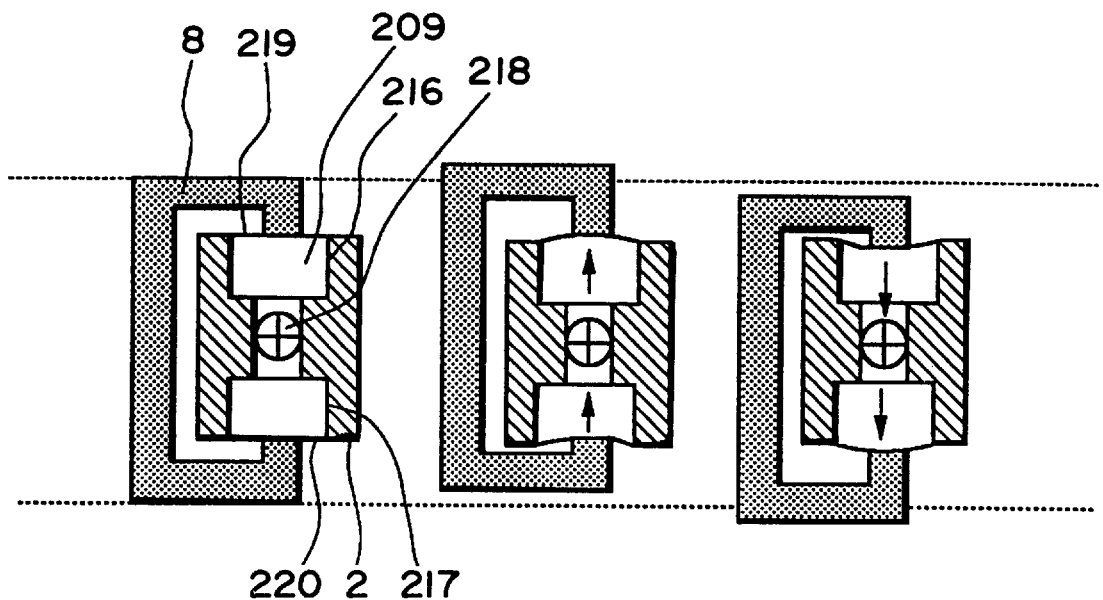
FIG. 22 is a schematic view for explaining operation of a driving portion of the mechanism of FIG. 21.

FIG. 21 is a sectional view of an optical element moving mechanism according to a seventh embodiment of the present invention. The mechanism produces a drive on the basis of a change in pressure of a fluid 209 within containers 216 and 217 which are enclosed by a flange 2 and two diaphragms 219 and 220 having the same shape and having circular bores at the centers. FIG. 22 illustrates the operation of the mechanism. As the fluid 209 within the container 216 is moved into the container 217 by a small pump 218 disposed between the containers 216 and 217, the pressure in the container 217 rises and the pressure within the container 216 decreases. Thus, paired diaphragms 219 and 220 produce deformation corresponding to the pressures in the containers 216 and 217, and the cell 8 is moved downwardly as viewed in FIG. 9. When the pump operates in reversed fashion, the cell 8 moves upwardly as viewed in FIG. 9.

In the structure described above, the cell 8 and two sets of diaphragms 219 and 220 are formed into an integral structure, and freedom of the cell 8 is restricted. Thus, the cell 8 is guided in dependence upon the two diaphragms 219 and 220 and, therefore, the mechanism can be made compact.

[Embodiment 8]

Figure 23:
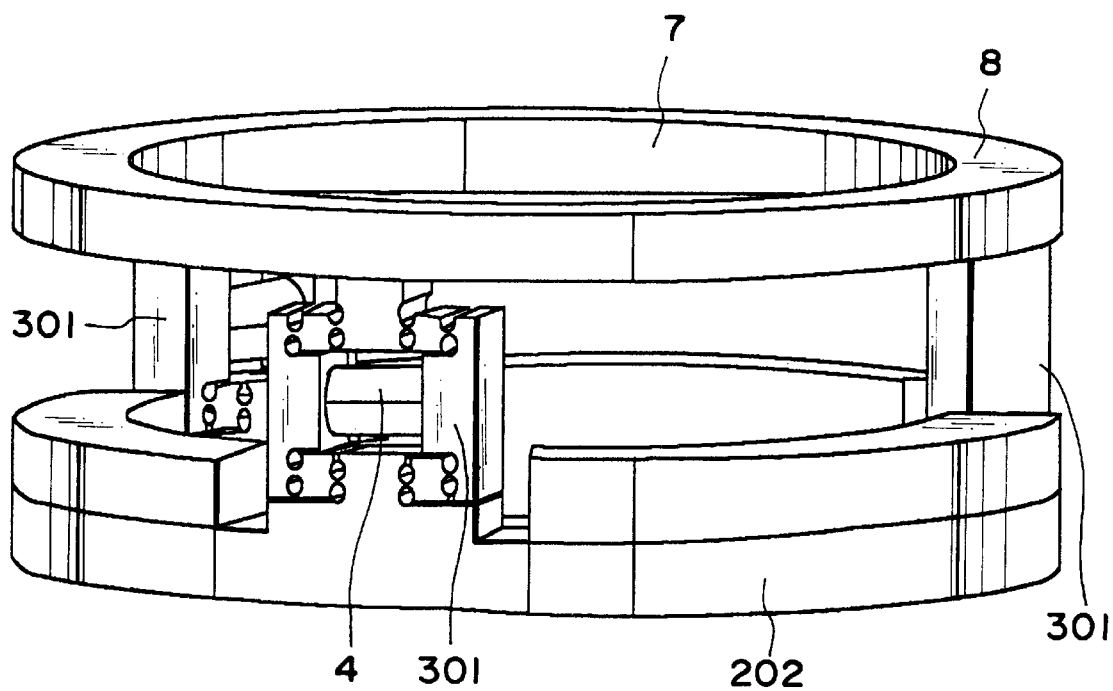
FIG. 23 is a perspective view, partially in section, of a lens moving mechanism with a displacement magnifying mechanism, according to an eighth embodiment of the present invention.
Figure 24A:
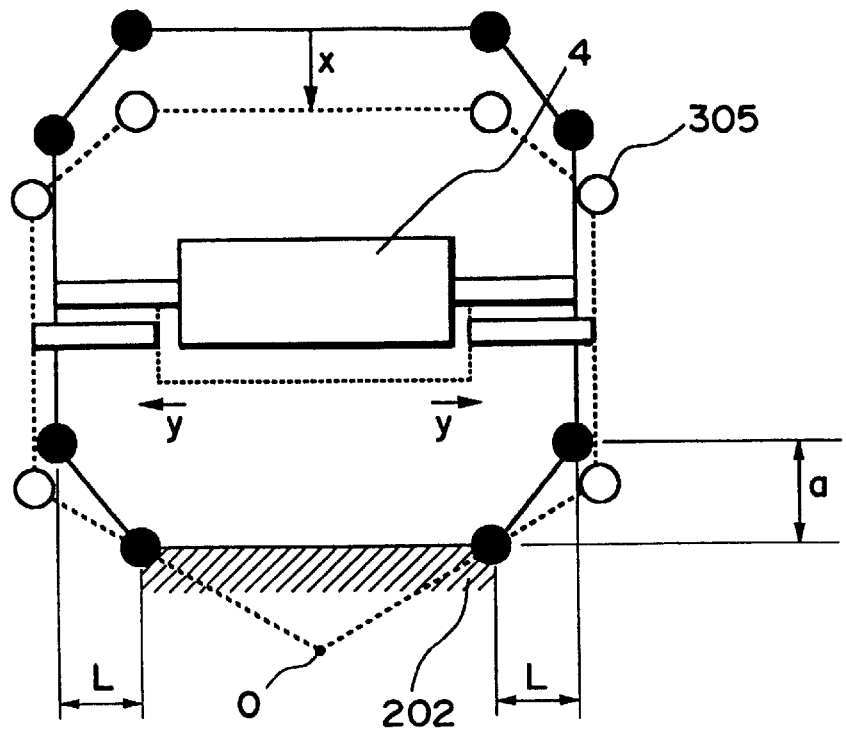
FIGS. 24A and 24B are a schematic view and a perspective view for explaining the operation and structure of the displacement magnifying mechanism of FIG. 23.
Figure 24B:
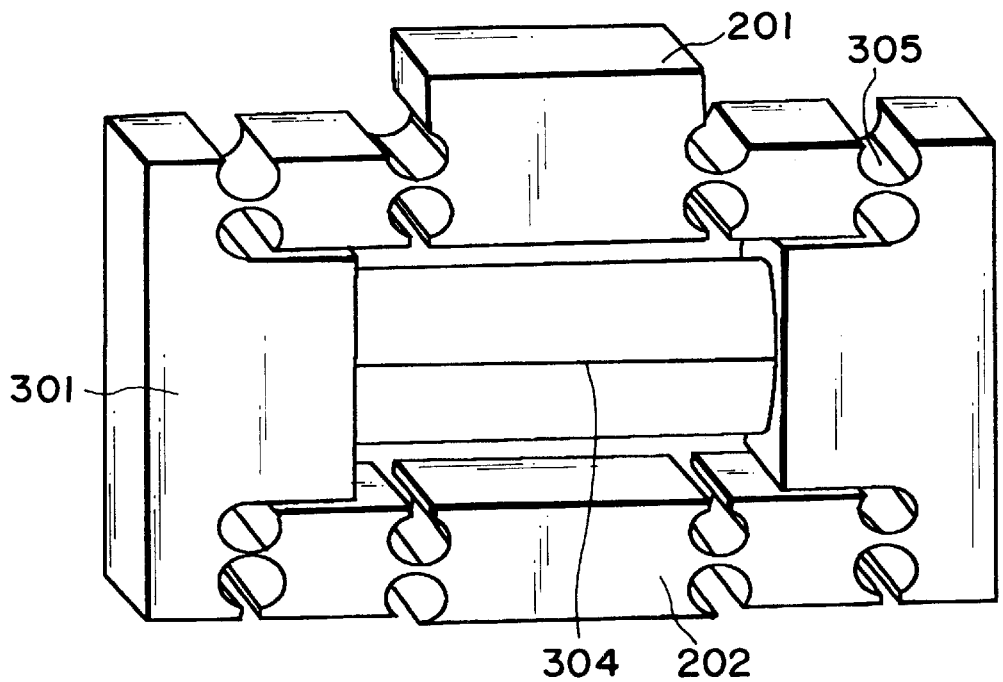

FIG. 23 shows a general structure of an optical component moving mechanism according to an eighth embodiment of the present invention. The mechanism comprises displacement magnifying mechanisms 301 each formed by an integral blank, which are provided symmetrically with respect to the optical axis. FIG. 23 shows an example where three displacement magnifying mechanisms are used. Each displacement magnifying mechanism has its output portion connected to the cell 8 which supports an adjusting lens 7 for correcting magnification or aberration, for example. FIG. 24A illustrates general structure of the displacement magnifying mechanism 301, and FIG. 24B illustrates details thereof. In the displacement magnifying mechanism 301, the relation between a displacement Y of a driving element 4, comprising a piezoelectric device or fluid enclosure means such as a bellows or cylinder, and an output displacement X of the mechanism (i.e., the movement amount of the adjusting lens 7) can be expressed as follows:

$$X=(a/L)Y\{1+[1+(a/L)](Y/4a)+[1+(a/L)](Y/8L)...\}$$

wherein "a" and L are parameters for determining the shape such as shown in FIG. 24.

The above equation means that, if displacement Y of input element is small and (a/L)>1, the displacement Y is magnified (a/L) times.

Figure 25:
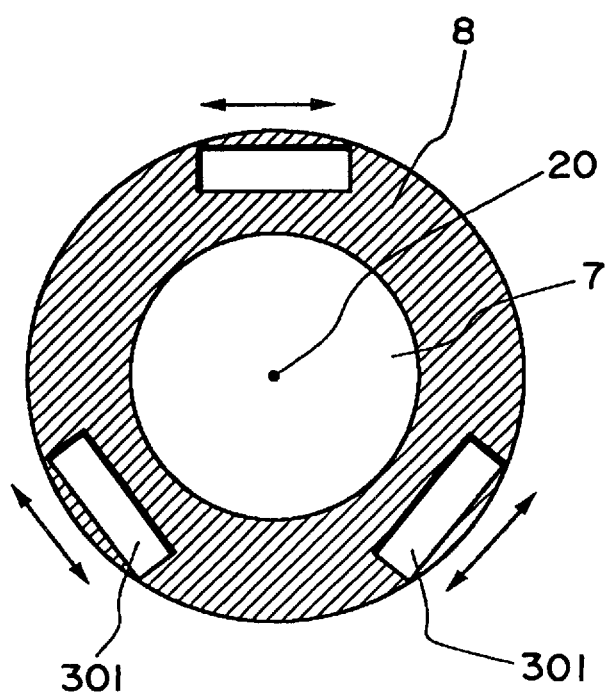
FIG. 25 is a schematic view for explaining disposition of the mechanism of FIG. 23.

On the other hand, since this mechanism has a freedom of rotation about the zero (0) point, if the mechanisms 301 are disposed uniformly upon the cell 8 as shown in FIG. 25, then the adjusting lens 7 has a freedom of rotation about the optical axis but no translational eccentricity is allowed. This is because notches of a notched spring 305 are disposed towards the center of the optical element moving mechanism, that is, toward the optical axis.

The displacement magnifying mechanism 301 comprises an arcuate-shaped or square-shaped notched spring 305 which may be formed in an integral structure by machining a blank by using an end mill, for example. This reduces degradation of motion precision due to an assembling error.

On the other hand, any discrepancy in output displacement among the displacement magnifying mechanisms disposed in the mechanism causes a tilt error of the adjusting lens 7. This attributes, when piezoelectric devices are used as the driving elements 4, to dispersion of output displacement of them or to production precision of the displacement magnifying mechanisms 301. Such discrepancy can be reduced relatively easily by adjusting, beforehand, the voltages to be applied to the drive sources. The driving element 4 may comprise fluid enclosure means such as a bellows or cylinder. In that occasion, only one driving element 4 can actuate the displacement magnifying mechanisms 301, that is, the optical component moving mechanism.

[Embodiment 9]

Figure 26A:
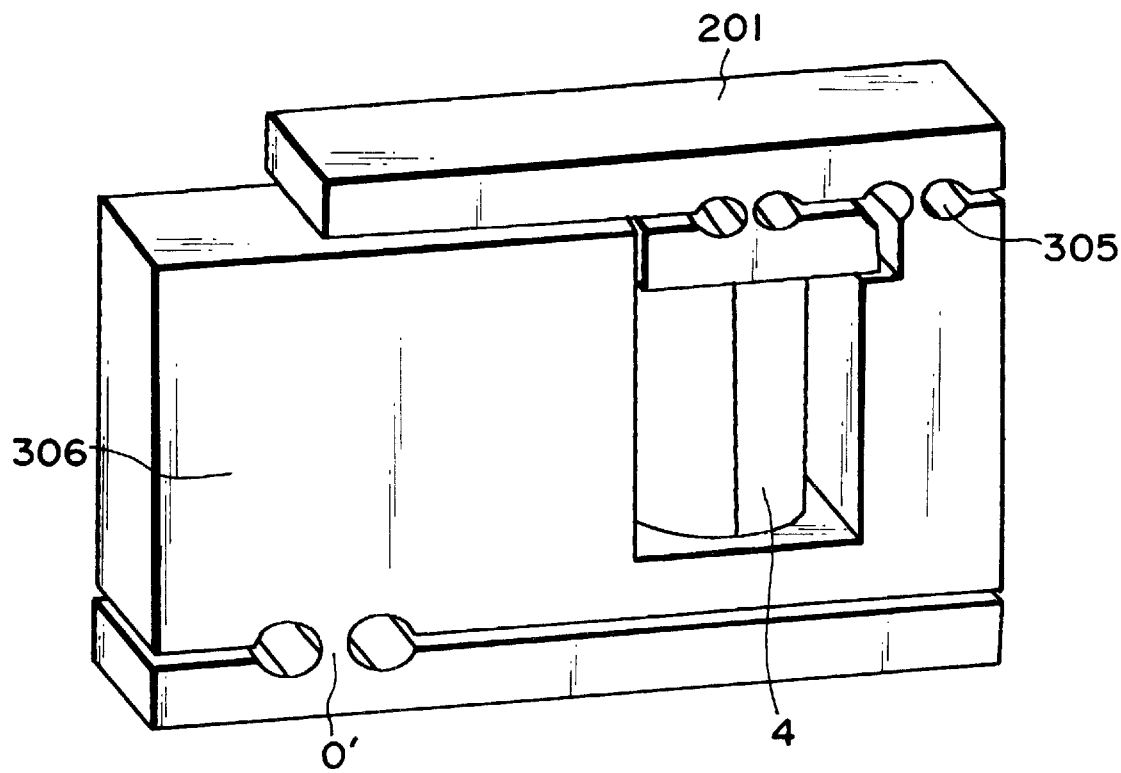
FIGS. 26A and 26B are a perspective view and a schematic view of a lever magnifying mechanism according to a ninth embodiment of the present invention.
Figure 26B:
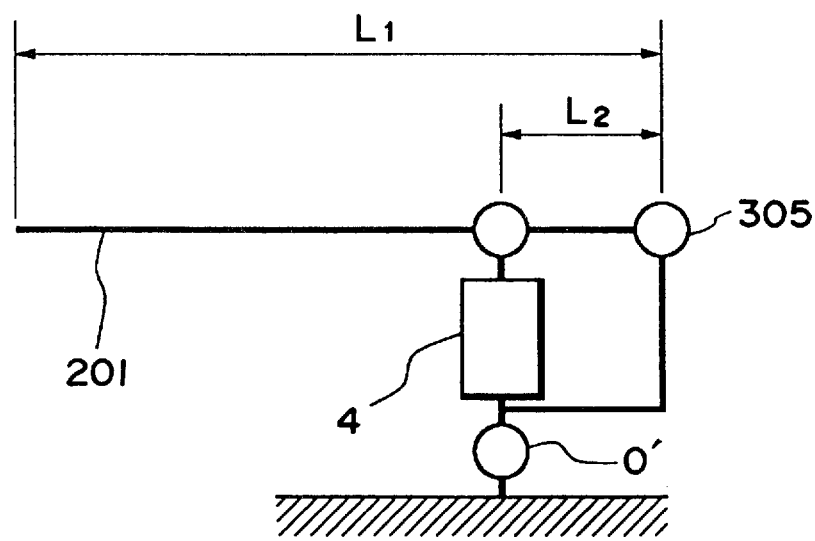

A function similar to that of the displacement magnifying mechanism 301 of the eighth embodiment can be provided by a lever magnifying mechanism 306 such as shown in FIG. 26A. Also in this embodiment, the mechanism comprises lever magnifying mechanisms 306 each formed by an integral blank, which are provided symmetrically with respect to the optical axis. Each lever magnifying mechanism has its output portion connected to the cell 8 which supports an adjusting lens 7 for correcting magnification or aberration, for example. FIG. 26B illustrates general structure of the lever magnifying mechanism 301. In the lever magnifying mechanism 306, the relation between a displacement Y of an input element, comprising a piezoelectric device or fluid enclosure means such as a bellows or cylinder, and an output displacement X of the mechanism (i.e., the movement amount of the adjusting lens 7) can be expressed as follows:

$$X=(L_1/L_2)Y$$

wherein $L_1$ and $L_2$ are parameters for determining the shape such as shown in FIG. 26B. This equation means that, if $(L_1/L_2)>1$, the displacement Y is magnified $(L_1/L_2)$ times.

As shown in FIG. 26B, since this mechanism has a freedom of rotation about a point 0', if the mechanisms 306 are disposed uniformly upon the cell 8, then the adjusting lens 7 has a freedom of rotation about the optical axis but no translational eccentricity is allowed. This is because notches of a notched spring 305 are disposed towards the center of the mechanism, that is, toward the optical axis.

The lever magnifying mechanism 301 comprises an arcuate-shaped or square-shaped notched spring 305 which may be formed in an integral structure by machining a blank by using an end mill, for example. This reduces degradation of motion precision due to an assembling error.

On the other hand, any discrepancy in output displacement among the lever magnifying mechanisms disposed in the mechanism causes a tilt error of the adjusting lens 7. This attributes, when piezoelectric devices are used as the driving elements 4, to dispersion of output displacement of them or to production precision of the lever magnifying mechanisms 306. Such discrepancy can be reduced relatively easily by adjusting, beforehand, the voltages to be applied to the drive sources. The driving element 4 may comprise fluid enclosure means such as a bellows or cylinder. In that occasion, only one driving element 4 can actuate the lever magnifying mechanisms 306, that is, the optical component moving mechanism.

[Embodiment 10]

A function similar to that of the displacement magnifying mechanism 301 of the eighth embodiment can be provided by an integral-type parallel spring mechanism 307 such as shown in FIG. 27. Also in this embodiment, the structure comprises integral-type parallel spring mechanisms 307 each formed by an integral blank, which are provided symmetrically with respect to the optical axis. Each parallel spring mechanism has its output portion connected to the cell 8 which supports an adjusting lens 7 for correcting magnification or aberration, for example.

As shown in FIG. 27, since this mechanism has a freedom of rotation about a point 0", if the mechanisms 307 are disposed uniformly upon the cell 8, then the adjusting lens 7 has a freedom of rotation about the optical axis but no translational eccentricity is allowed. This is because notches of a notched spring 305 are disposed towards the center of the mechanism, that is, toward the optical axis.

The integral-type parallel spring mechanism 301 comprises an arcuate-shaped or square-shaped notched spring 305 which may be formed in an integral structure by machining a blank by using an end mill, for example. This reduces degradation of motion precision due to an assembling error.

On the other hand, any discrepancy in output displacement among the parallel spring mechanisms disposed in the mechanism causes a tilt error of the adjusting lens 7. This attributes, when piezoelectric devices are used as the driving elements 4, to dispersion of output displacement of them or to production precision of the lever magnifying mechanisms 306. Such discrepancy can be reduced relatively easily by adjusting, beforehand, the voltages to be applied to the drive sources. The driving element 4 may comprise fluid enclosure means such as a bellows or cylinder. In that occasion, only one driving element 4 can actuate the lever magnifying mechanisms 306, that is, the optical component moving mechanism.

The eighth to tenth embodiments described above can provide a magnification correction mechanism with small translational eccentricity and small tilt error, in a limited space.

[Embodiment 11]

Next, an embodiment of a device manufacturing method which uses an exposure apparatus having been described hereinbefore, will be explained.

Figure 28:
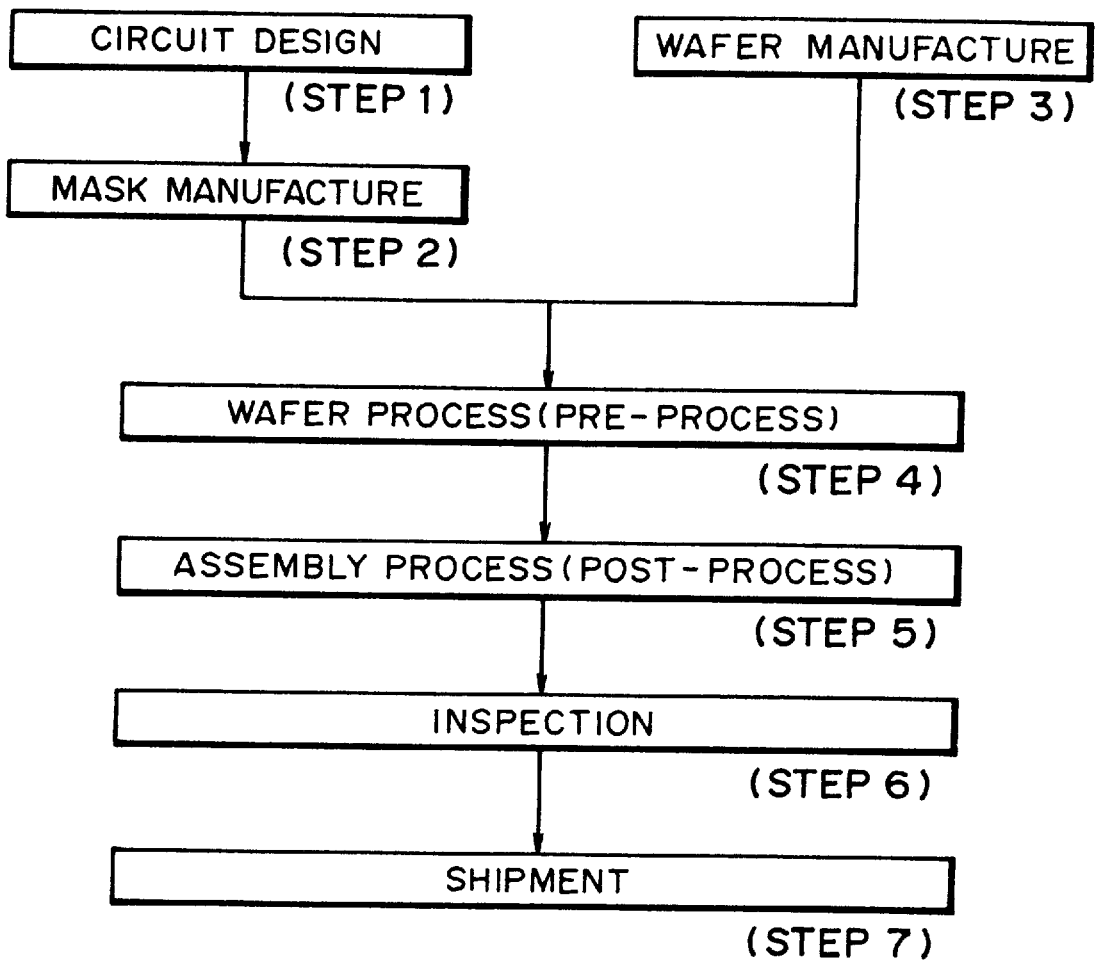
FIG. 28 is a flow chart for explaining semiconductor device manufacturing processes.

FIG. 28 is a flow chart of the sequence of manufacturing a microdevice such as a semiconductor chip (e.g. IC or LSI), a liquid crystal panel, a CCD, a thin film magnetic head or micro-machine for example. Step 1 is a design process for designing the circuit of a semiconductor device. Step 2 is a process for manufacturing a mask on the basis of the circuit pattern design. Step 3 is a process for manufacturing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 29:
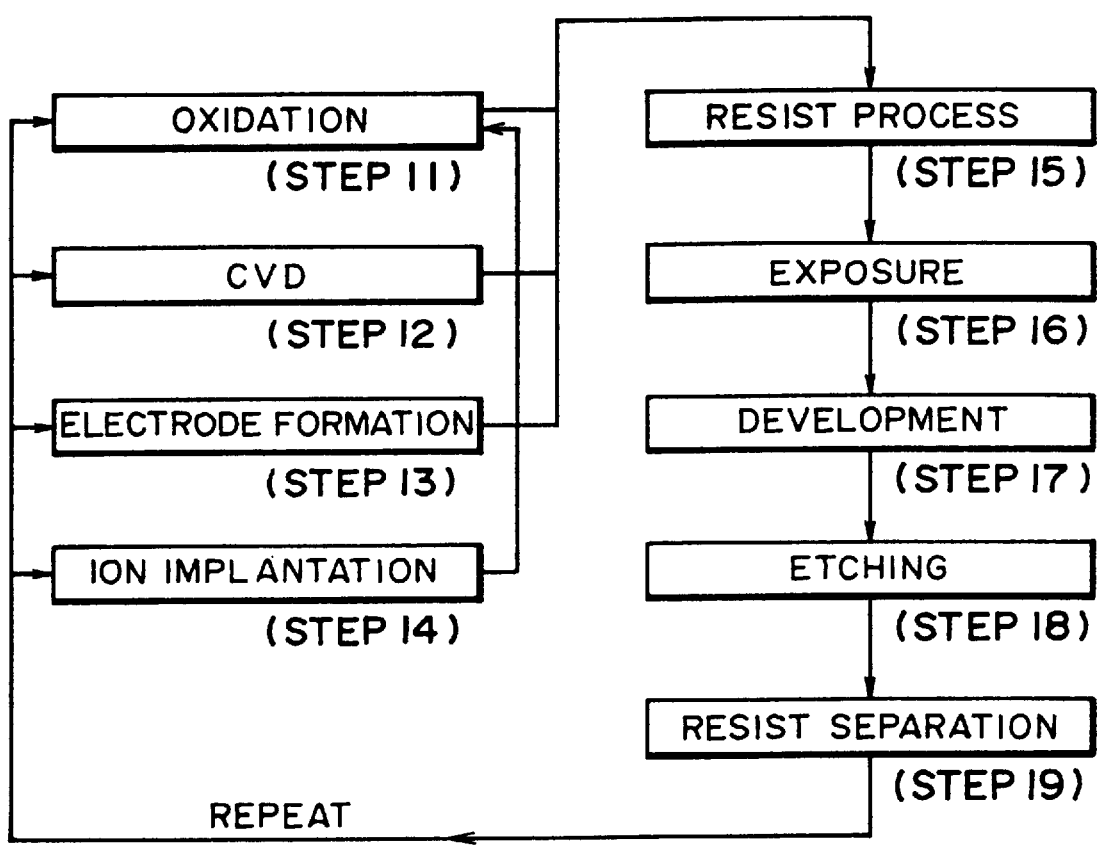
FIG. 29 is a flow chart for explaining details of a wafer process.
Figure 30:
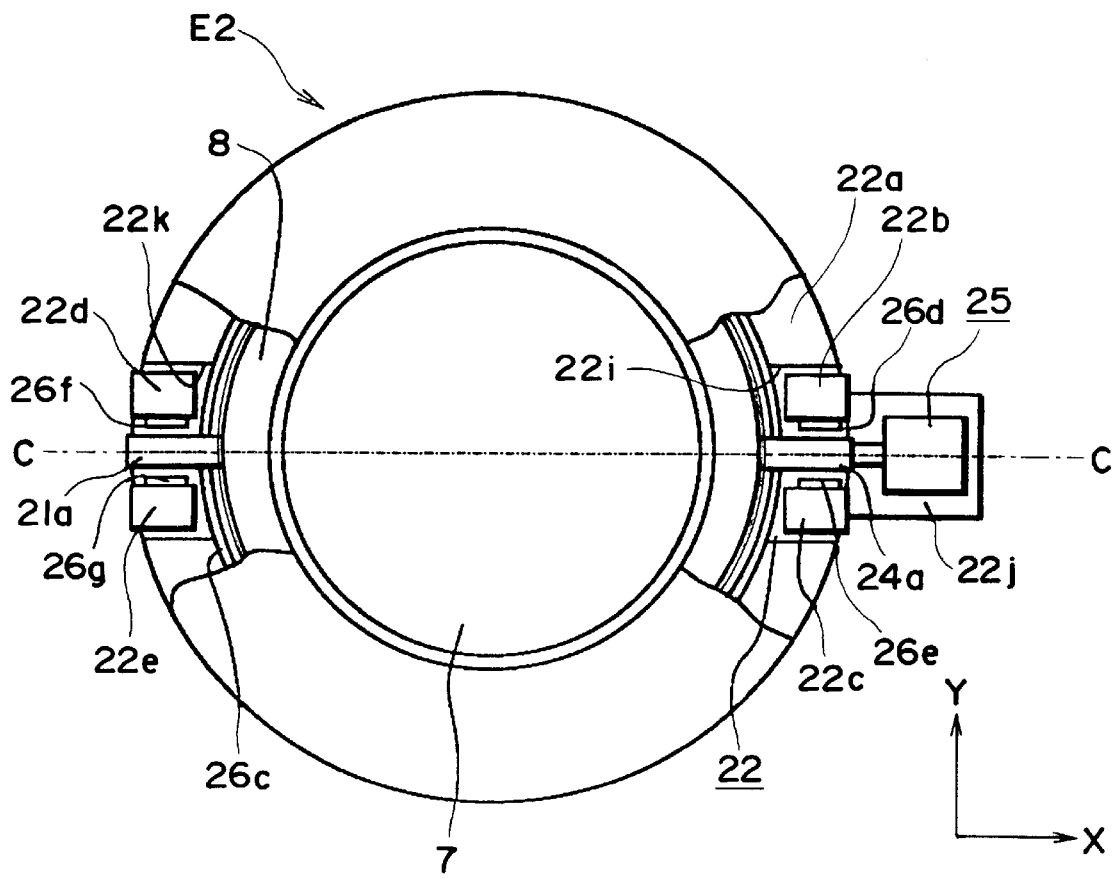
FIG. 30 is a plan view of a wedge-shaped diaphragm mechanism of known type.
Figure 31:
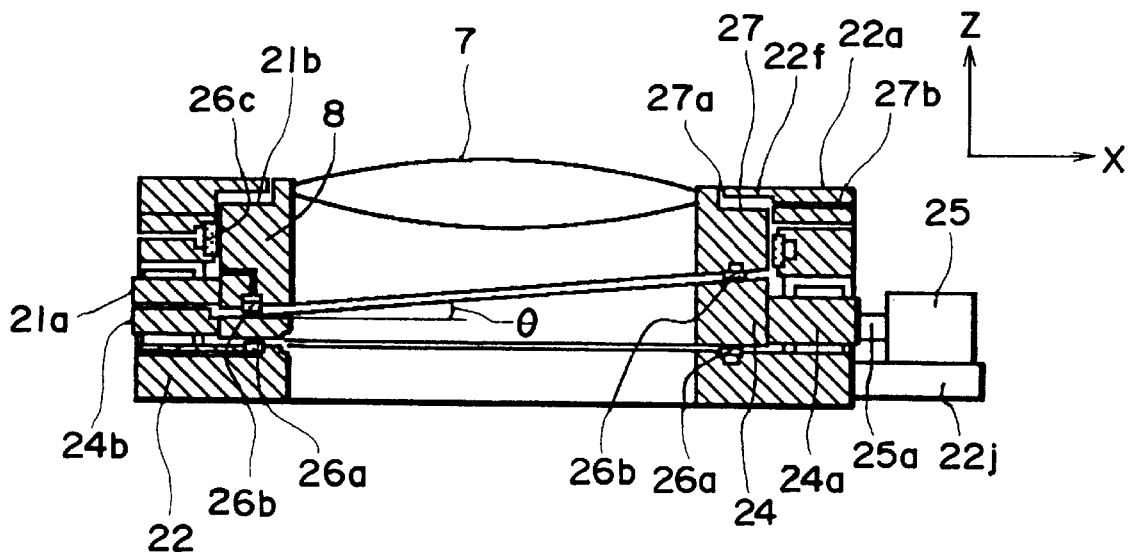
FIG. 31 is a sectional view taken along a line C—C in FIG. 30.

FIG. 29 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An optical structure having driving means and guiding means, for moving an optical element along a direction of an optical axis, wherein:
    the optical element is fixed to a movable table of ring-like shape about the optical axis of the optical element; and
    said movable table is connected to a ring-like fixed table disposed concentrically with said movable table, through a plurality of driving elements constituting said driving means and a plurality of leaf springs constituting said guiding means.

2. A structure according to claim 1, wherein said driving elements are disposed in spaces between said leaf springs.

3. A structure according to claim 2, wherein the number of said leaf springs and the number of said driving elements are not mutually prime.

4. A structure according to claim 2, wherein said leaf springs are disposed in sets at opposite end faces of said movable table and fixed table.

5. A structure according to claim 4, wherein a half of the number of said leaf springs and the number of said driving elements are not mutually prime.

6. A structure according to claim 1, wherein a used operational range of said leaf springs is at only one side of a neutral point of said leaf springs.

7. A structure according to claim 1, wherein said movable table is provided with a sensor target plate movable with the motion of the optical element, and wherein each of said leaf springs is connected at its opposite ends to said sensor target plate and a member at the fixed table side, respectively.

8. A structure according to claim 7, wherein each of said leaf springs is formed with a notch of one of U-shave and O-shape, for fixation of said movable table.

9. A structure according to claim 1, wherein a set of or each of sets of said leaf springs for connecting said movable table and said fixed table with each other comprises an integral structure.

10. An optical structure having driving means and guiding means, for moving an optical element in a direction of an optical axis, wherein:
    said guiding means comprises a resilient member; and
    said driving means comprises displacement measuring means for measuring positional information of the optical element, wherein said driving means has a motion origin, which is a temporal origin for absolute position correction of said displacement measuring means, at a deformation bottom point of said resilient member.

11. An optical structure having driving means and guiding means, for moving an optical element in a direction of an optical axis, wherein:
    said guiding means comprises a resilient member; and
    said driving means comprises displacement measuring means for measuring positional information of the optical element and a supporting member for supporting said displacement measuring means, wherein said supporting member has a protrusion which is a temporal origin for absolute position correction of said displacement measuring means.

12. A structure according to claim 11, wherein said displacement measuring means measures distance to a target plate being disposed opposed to said displacement measuring means and being movable with the motion of the optical element, and wherein said target plate is electrically isolated from a movable member for holding the optical element.

13. A structure according to claim 11, wherein said displacement measuring means measures distance to a target plate being disposed opposed to said distance measuring means and being movable with the motion of the optical element, wherein an origin point position detecting plate is mounted on said target plate while being electrically isolated therefrom, and wherein said driving means detects the movement origin on the basis of contact between said origin point position detecting plate with said protrusion, for correction of the origin.

14. A structure according to claim 11, wherein said displacement measuring means is disposed at a position below said protrusion.

15. An optical structure having driving means and guiding means, for moving an optical element in a direction along an optical axis, wherein:
    said guiding means guides said optical element by using resilient deformation of a leaf spring; and
    a member for supporting the leaf spring and a portion of a driving element constituting said driving means are connected to a clamping top plate which is integrally fixed to the optical element.

16. A structure according to claim 15, wherein said clamping top plate has a shape formed by chamfering a disc concentric with respect to the optical axis, concentrically with respect to the optical axis.

17. A structure according to claim 15, wherein said clamping top plate has a notch or chamfered portion formed in a portion adjacent to a cell for supporting the optical element.

18. A structure according to claim 15, wherein said clamping top plate is provided with a target plate with which the movement amount of the optical element is measured, and a weight for balancing with the weight and gravity center of said target plate.

19. An optical structure having driving means and guiding means, for moving an optical element in a direction along an optical axis, wherein:

said guiding means comprises a mechanism including a spring with a notch formed in a radial direction to the optical axis, said spring being resiliently deformable perpendicularly to the surface of the notch.

20. A structure according to claim 19, wherein said driving means comprises a driving element which includes one of a piezoelectric device and fluid enclosure means.

21. An optical structure having driving means and guiding means, for moving an optical element in a direction along an optical axis, wherein:

said guiding means comprises first and second blanks which are divided along the optical axis direction, wherein each blank has a fixed portion, a movable portion for holding the optical element, and a leaf spring for connecting said fixed portion and said movable portion with each other.

* * * * *

UNITED STATES PATENT AND TRADEMARK OFFICE
CERTIFICATE OF CORRECTION

PATENT NO. : 5,822,133

DATED : October 13, 1998

INVENTOR(S) : MAKOTO MIZUNO, ET AL.  Page 1 of 2

It is certified that error appears in the above-identified patent and that said Letters Patent is hereby corrected as shown below:

COLUMN 3,
Line 3, "a re" should read --are--.

COLUMN 6,
Line 34, "to" should be deleted.

COLUMN 12,
Line 13, "If however" should read --If, however,--.

COLUMN 13,
Line 36, "be" (second occurrence) should be deleted;
Line 38, "reduces" should read --reduce--; and
Line 64, "or" (second occurrence) should be deleted.

COLUMN 14,
Line 50, "If however" should read --If, however,--.

COLUMN 16,
Line 6, "method" should read --methods--.

COLUMN 17,
Line 59, "having" should read --has--.

UNITED STATES PATENT AND TRADEMARK OFFICE
CERTIFICATE OF CORRECTION

PATENT NO.  : 5,822,133

DATED       : October 13, 1998

INVENTOR(S) : MAKOTO MIZUNO, ET AL.

It is certified that error appears in the above-identified patent and that said Letters Patent is hereby corrected as shown below:

COLUMN 18,
Line 31, "having" should read --has--.

COLUMN 22,
Line 10, "U-shave" should read --U-shape--.

Signed and Sealed this

Twenty-ninth Day of June, 1999

Attest:

Q. TODD DICKINSON

Attesting Officer    Acting Commissioner of Patents and Trademarks